US006835522B2

(12) United States Patent
Minami et al.

(10) Patent No.: US 6,835,522 B2
(45) Date of Patent: Dec. 28, 2004

(54) HEAT-SENSITIVE RECORDING MATERIAL

(75) Inventors: Kazumori Minami, Shizuoka-ken (JP); Masanobu Takashima, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/095,711

(22) Filed: Mar. 13, 2002

(65) Prior Publication Data

US 2002/0187417 A1 Dec. 12, 2002

(30) Foreign Application Priority Data

Mar. 14, 2001 (JP) ....................................... 2001-073152

(51) Int. Cl.[7] ................................................ G03F 7/021

(52) U.S. Cl. ....................... 430/138; 430/157; 430/162; 430/177

(58) Field of Search ................................ 430/138, 157, 430/162, 177

(56) References Cited

U.S. PATENT DOCUMENTS

| | | | | |
|---|---|---|---|---|
| 4,344,830 A | | 8/1982 | Olson | |
| 4,775,707 A | | 10/1988 | Slongo et al. | |
| 5,030,731 A | | 7/1991 | Slongo et al. | |
| 5,679,494 A | * | 10/1997 | Minami et al. | 430/138 |

FOREIGN PATENT DOCUMENTS

| | | |
|---|---|---|
| JP | 7-276808 | 10/1995 |
| JP | 9-1928 | 1/1997 |
| JP | 11-291629 | 10/1999 |
| JP | 3094609 | 8/2000 |

* cited by examiner

*Primary Examiner*—John S. Chu
(74) *Attorney, Agent, or Firm*—Sughrue Mion, PLLC

(57) ABSTRACT

Disclosed is a heat-sensitive recording material containing an ultraviolet light absorber precursor which forms an ultraviolet light absorber by being irradiated with light, and a hydrogen donor.

23 Claims, No Drawings

HEAT-SENSITIVE RECORDING MATERIAL

BACKGROUND OF THE INVENTION

1. Field of the Invention

The present invention relates to a heat-sensitive recording material and more particularly to a heat-sensitive recording material excellent in lightfastness.

2. Description of the Related Art

In recent years, heat-sensitive recording has made remarkable progress because the recording apparatus for heat-sensitive recording are simple, highly reliable, and maintenance-free. Examples of widely known heat-sensitive recording materials are a heat-sensitive recording material utilizing the reaction between an electron-donating colorless dye and an electron-accepting compound, and a heat-sensitive recording material utilizing the reaction between a diazonium salt compound and a coupler.

However, the heat-sensitive recording material is associated with a problem that, when it is exposed to sunlight for a long time or when it is posted on the wall in an office or the like for a long period of time, its background becomes colored and the image portions may discolor or fade.

Japanese Patent Application Laid-Open (JP-A) No.9-1928 describes a heat-sensitive recording material which uses a precursor of an ultraviolet light absorber in order to prevent the coloration of the background and the discoloration or fading of the image portions and exhibits excellent lightfastness and fixing performance. This precursor of an ultraviolet light absorber functions as an ultraviolet light absorber after it reacts due to the effect of light or heat when irradiated with light whose wavelength is in a region necessary for fixing by irradiation with light in a photo-fixing type heat-sensitive recording layer. For this reason, a large proportion of the light within an ultraviolet region is absorbed by the ultraviolet light absorber and the ultraviolet light transmittance of the heat-sensitive recording material is lowered. Therefore, the lightfastness of the heat-sensitive recording material is enhanced.

However, if the precursor of an ultraviolet light absorber was used alone, the problem encountered was that the efficiency of the ultraviolet light absorber formation was low when the ultraviolet light absorber was formed by irradiation with light.

SUMMARY OF THE INVENTION

The present invention provides a heat-sensitive recording material which is excellent in lightfastness and solves the problem that the efficiency of the ultraviolet light absorber formation is low and thus overcomes the above-mentioned problems.

That is, the first aspect of the present invention is a heat-sensitive recording material containing an ultraviolet light absorber precursor which forms an ultraviolet light absorber by being irradiated with light and a hydrogen donor. Preferably, the ultraviolet light absorber precursor is at least one kind selected from the compounds represented by the following general formulae (1) to (4).

General formula (1)

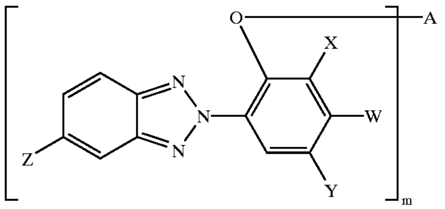

General formula (2)

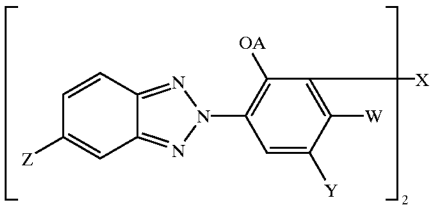

General formula (3)

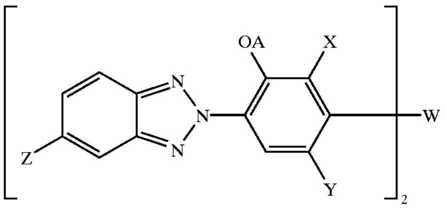

General formula (4)

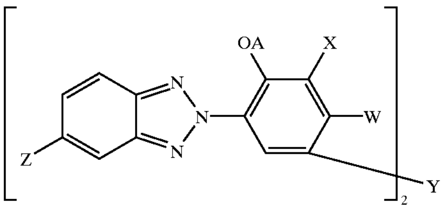

In the general formulae (1) to (4), m represents 1 or 2. A represents —$SO_2$—R, —CO—R, —$CO_2$—R, —CONH—R, —$POR_1R_2$, —$CH_2R_3$, or $SiR_4R_5R_6$ in the general formula (1) where m is 1 and in the general formulae (2) to (4). A represents —$SO_2R_7SO_2$—, —CO—, —COCO—, —$COR_7CO$—, —$SO_2$—, or SO— in the general formula (1) where m is 2. X represents a hydrogen atom, an alkyl group, an alkoxy group, an aryl group, or a halogen atom in the general formulae (1), (3), and (4). X represents an alkylene group, —$OR_7O$—, or $OCOR_7CO_2$— in the general formula (2). W represents a hydrogen atom, an alkyl group, an alkoxy group, an aryl group, or a halogen atom in the general formulae (1), (2), and (4). W represents —$OR_7O$— or $OCOR_7CO_2$— in the general formula (3). Y represents a hydrogen atom, an alkyl group, an alkoxy group, an aryl group, or a halogen atom in the general formulae (1), (2), and (3). Y represents —$OR_7O$—, —$OCOR_7CO_2$—, —$CH_2CH_2CO_2R_7OCOCH_2CH_2$—, —$CH_2CH_2OCOR_7CO_2CH_2CH_2$—, or $CH_2CH_2CON(R_8)R_7N(R_8)COCH_2CH_2$— in the general formula (4). Z represents a hydrogen atom, a halogen atom, an alkyl group, or an alkoxy group. In the groups listed above, R represents an alkyl group or an aryl group. $R_1$ and $R_2$ each represents an alkoxy group, an aryloxy group, an alkyl group, or an aryl group. $R_3$ represents a phenyl group bearing at least one nitro or methoxy group as a substituent. $R_4$, $R_5$, and $R_6$ each represents an alkyl group or an aryl group. $R_7$ represents an alkylene group or an arylene group. $R_8$ represents a hydrogen atom or an alkyl group.

It is preferable that the hydrogen donor has at least one group selected from an aromatic OH group, an aliphatic OH group, a heterocyclic OH group, an aromatic SH group, an aliphatic SH group, a heterocyclic SH group, an aromatic NH group, an aliphatic NH group, and a heterocyclic NH group.

Another aspect of the present invention is a heat-sensitive recording material comprising a support, a photo-fixing type heat-sensitive recording layer, an interlayer, and a protective layer, each provided on the support, wherein at least one of these layers contains an ultraviolet light absorber precursor and a hydrogen donor.

Still another aspect of the present invention is a multicolor heat-sensitive recording material which comprises a support and a plurality of photo-fixing type heat-sensitive recording layers provided on the support and contains an ultraviolet light absorber precursor and a hydrogen donor, wherein the photo-fixing type heat-sensitive layers develop the three primary colors for subtractive color mixing, i.e., yellow, magenta, and cyan, respectively, so that full-color recording can be made.

DESCRIPTION OF THE PREFERRED EMBODIMENTS

<Heat-Sensitive Recording Material>

The heat-sensitive recording material of the present invention contains at least one compound selected from the compounds represented by the following formulae (1) to (4) and a hydrogen donor.

General formula (1)

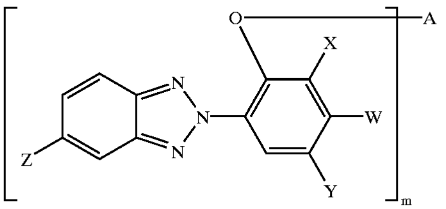

General formula (2)

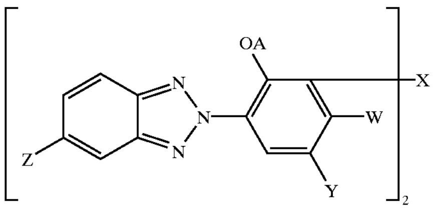

General formula (3)

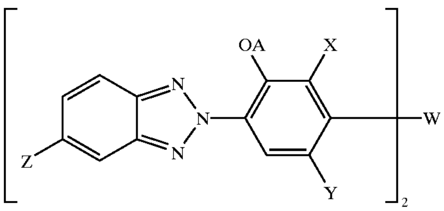

-continued

General formula (4)

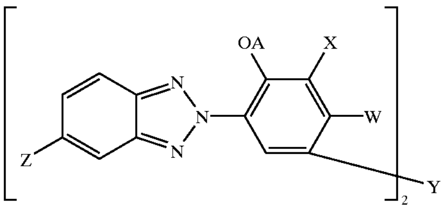

The compounds represented by the general formulae (1) to (4) are so-called precursors of ultraviolet light absorbers and form ultraviolet light absorbers by being irradiated with light. The compounds represented by the general formulae (1) to (4) are hereinafter referred to as "ultraviolet light absorber precursors" upon occasion. The heat-sensitive recording material of the present invention contains a hydrogen donor in addition to the ultraviolet light absorber precursor. For this reason, the supply source, which supplies hydrogen to the ultraviolet light absorber precursor is increased and the efficiency of the formation of the ultraviolet light absorber is enhanced. The term "hydrogen donor" as used in the present invention means a compound which donates hydrogen to the ultraviolet light absorber precursor.

(Hydrogen Donor)

Examples of the hydrogen donor include hydroquinone compounds, hydrazide compounds, hydroxy compounds, phenidone compounds, catechol compounds, resorcinol compounds, hydroxyhydroquinone compounds, pyrrologlycinol compounds, phenol compounds, phenylhydrazide compounds, gallic acid compounds, ascorbic acid compounds, and ethylene glycol compounds. These are described in JP-A Nos.3-191341, 3-25434, 1-252953, 2-302753, 1-129247, 1-227145, 1-243048, 2-262649, etc.

Among the hydrogen donors listed above, preferable is a hydrogen donor (an OH group-bearing hydrogen donor) having at least one group selected from an aromatic OH group, an aliphatic OH group, and a heterocyclic OH group; a hydrogen donor (an SH group-bearing hydrogen donor) having at least one group selected from an aromatic SH group, an aliphatic SH group, and a heterocyclic SH group; or a hydrogen donor (an NH group-bearing hydrogen donor) having at least one group selected from an aromatic NH group, an aliphatic NH group, and a heterocyclic NH group.

Examples of the OH group-bearing hydrogen donor include compounds represented by "heterocycle-OH", "$R^{10}$—COOH", etc., wherein $R^{10}$ represents an aliphatic group, an aromatic group, or a heterocyclic group. Examples of $R^{10}$ include octyl, dodecyl, octadecyl, 2-ethylhexyl, oleyl, phenyl, naphthyl, tolyl, cyclohexyl, and pyridyl groups. Examples of the OH group-bearing hydrogen donor include hydroquinone and derivatives thereof, phenol and derivatives thereof, hindered phenol and derivatives thereof, tocopherol and derivatives thereof, and ascorbic and derivatives thereof. The OH group-bearing hydrogen donor may have two or more OH groups. Preferred specific examples of the OH group-bearing hydrogen donor are given below.

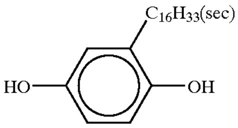
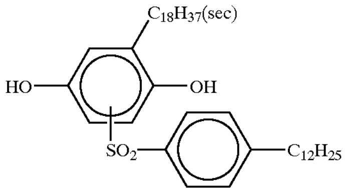
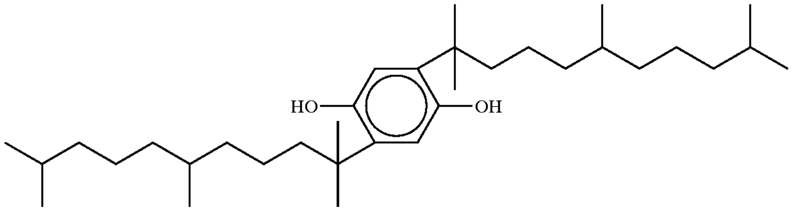
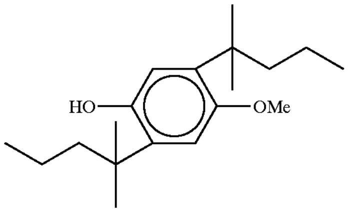
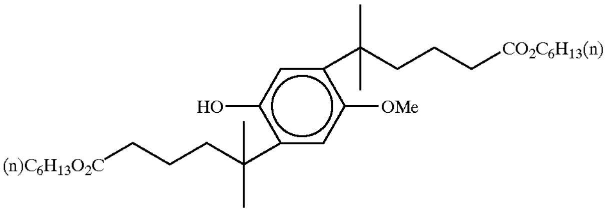
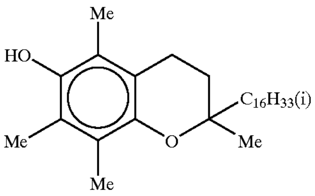
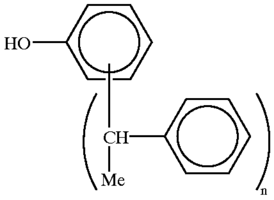
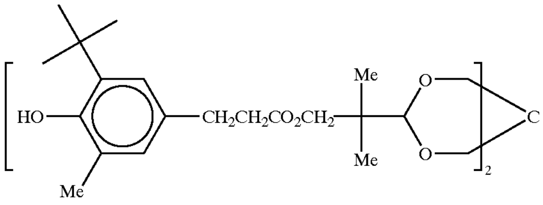
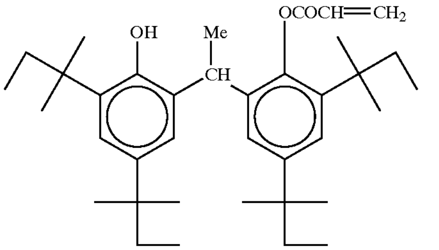
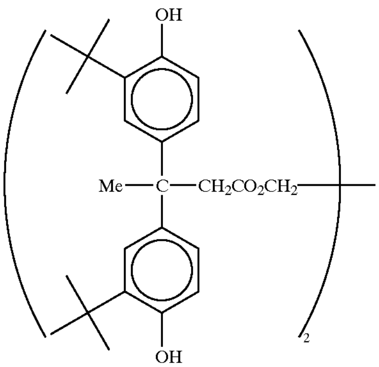
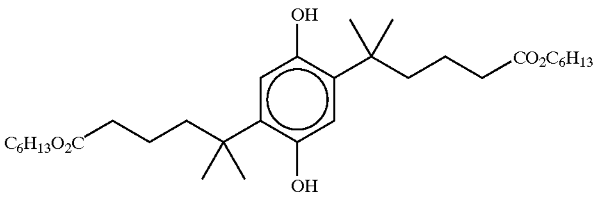

-continued

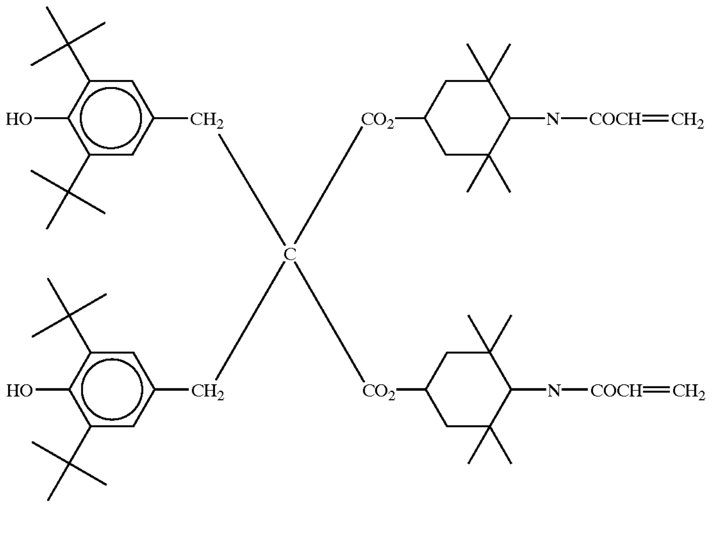

Examples of the SH group-bearing hydrogen donor include mercapto compounds represented by "heterocycle-SH" and compound represented by "$R^{11}$—COSH", etc., wherein $R^{11}$ represents an aliphatic group, an aromatic group, or a heterocyclic group. Examples of $R^{11}$ include octyl, dodecyl, octadecyl, 2-ethylhexyl, oleyl, phenyl, naphthyl, tolyl, cyclohexyl, and pyridyl groups. Examples of the SH group-bearing hydrogen donor include 2-mercaptobenzimidazole, 2-mercaptobenzoxazole, 2-mercaptobenzothiazole, etc. The SH group-bearing hydrogen donor may have two or more SH groups.

Examples of the NH group-bearing hydrogen donor include compounds represented by "heterocycle-NH—$R^{12}$", $R^{13}$—CONH—$R^{12}$", etc., wherein $R^{12}$ represents a hydrogen atom, an aliphatic group, an aromatic group, or a heterocyclic group and $R^{13}$ represents an aliphatic group, an aromatic group, or a heterocyclic group. Examples of $R^{12}$ include a hydrogen atom, and octyl, dodecyl, octadecyl, 2-ethylhexyl, oleyl, phenyl, naphthyl, tolyl, cyclohexyl, and pyridyl groups. Examples of $R^{13}$ include octyl, dodecyl, octadecyl, 2-ethylhexyl, oleyl, phenyl, naphthyl, tolyl, cyclohexyl, and pyridyl groups. Examples of the NH group-bearing hydrogen donor include primary amines and derivatives thereof, secondary amines and derivatives thereof, and compounds having a urea linkage. The NH group-bearing hydrogen donor may have two or more NH groups. Preferred specific examples of the NH group-bearing hydrogen donor are given below.

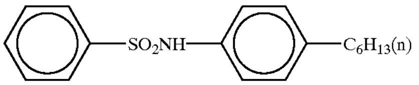

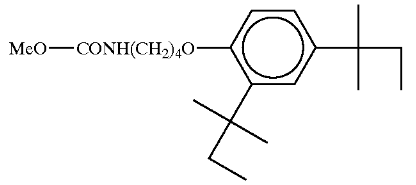

-continued

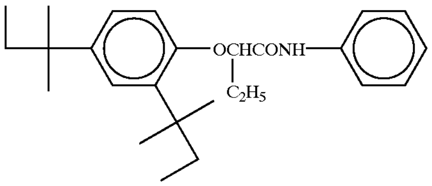

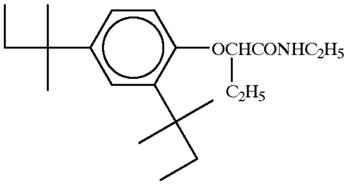

Besides the hydrogen donors listed above, it is possible to use hydrogen donors such as an ester (e.g., triethanolamine acetate) prepared by esterification of an amine having a hydroxyalkyl group as a substituent, an ether having an oxyalkylene group (e.g., 2-benzyloxynaphthalene and 1,2-diphenoxyethane), etc.

Preferably, the heat-sensitive recording material of the present invention comprises a support and a photo-fixing type heat-sensitive recording layer and, if necessary, an interlayer and a protective layer may also be provided on the support. The hydrogen donor may be incorporated in any of these layers, with the proviso that the hydrogen donor is incorporated in the layer containing a compound represented by any of the general formulae (1) to (4). In some case, for example, the heat-sensitive recording material may have an additional layer such as a light transmittance controlling layer which contains the hydrogen donor and the ultraviolet light absorber precursor.

The proportion of the hydrogen donor is preferably 1 to 1000% by weight, more preferably 5 to 300% by weight, and most preferably 10 to 100% by weight relative to the compound represented by any of the general formulae (1) to (4). If the proportion is within the range of 1 to 1000% by weight, the compounds represented by the general formulae (1) to (4) can be converted efficiently into ultraviolet light absorbers.

(Compounds Represented by the General Formulae (1) to (4))

In the present invention, the compounds represented by the general formulae (1) to (4) function as precursors of ultraviolet light absorbers. These compounds do not function as ultraviolet light absorbers before the irradiation with light in the wavelength region necessary for fixing. For this reason, the light transmittance of the photo-fixing type heat-sensitive recording layer containing the precursor of ultraviolet light absorber is high. The precursor of ultraviolet light absorber sufficiently transmits the light in the wavelength region necessary for fixing and does not hinder the fixing of the photo-fixing type heat-sensitive recording layer. In addition, the visible light transmittance in the photo-fixing type heat-sensitive recording layer is also high.

After the compounds represented by the general formulae (1) to (4) are irradiated with light in the wavelength region necessary for fixing by light in the photo-fixing type heat-sensitive recording layer and react due to the effect of light or heat, the compounds function as ultraviolet light absorbers. For this reason, the light in an ultraviolet region is mostly absorbed by the ultraviolet light absorber. Accordingly, the ultraviolet light transmission of the light in an ultraviolet light region to the heat-sensitive layer is reduced and the lightfastness of the heat-sensitive layer is enhanced. On the other hand, since the ultraviolet light absorber does not absorb the visible light, the visible light transmittance in the heat-sensitive layer does not change substantially.

In the general formulae (1) to (4), m represents 1 or 2.

A represents $—SO_2—R$, $—CO—R$, $—CO_2—R$, $—CONH—R$, $—POR_1R_2$, $—CH_2R_3$, or $SiR_4R_5R_6$ in the general formula (1) where m is 1 and in the general formulae (2) to (4). A represents $—SO_2R_7SO_2—$, $—CO—$, $—COCO—$, $—COR_7CO—$, $—SO_2—$, or SO— in the general formula (1) where m is 2.

X represents a hydrogen atom, an alkyl group, an alkoxy group, an aryl group, or a halogen atom in the general formulae (1), (3), and (4). X represents an alkylene group, $—OR_7O—$, or $OCOR_7CO_2—$ in the general formula (2).

W represents a hydrogen atom, an alkyl group, an alkoxy group, an aryl group, or a halogen atom in the general formulae (1), (2), and (4). W represents $—OR_7O—$ or $OCOR_7CO_2—$ in the general formula (3).

Y represents a hydrogen atom, an alkyl group, an alkoxy group, an aryl group, or a halogen atom in the general formulae (1), (2), and (3). Y represents $—OR_7O—$, $—OCOR_7CO_2—$, $—CH_2CH_2CO_2R_7OCOCH_2CH_2—$, $—CH_2CH_2OCOR_7CO_2CH_2CH_2—$, or $CH_2CH_2CON(R_8)R_7N(R_8)COCH_2CH_2—$ in the general formula (4).

Z represents a hydrogen atom, a halogen atom, an alkyl group, or an alkoxy group.

In the groups listed above, R represents an alkyl group or an aryl group. $R_1$ and $R_2$ each represents an alkoxy group, an aryloxy group, an alkyl group, or an aryl group. $R_3$ represents a phenyl group bearing at least one nitro or methoxy group as a substituent. $R_4$, $R_5$, and $R_6$ each represents an alkyl group or an aryl group. $R_7$ represents an alkylene group or an arylene group. $R_8$ represents a hydrogen atom or an alkyl group.

Among the substituents listed above, the alkyl group may be a straight-chain alkyl group or a branched alkyl group. Further, the alkyl group may have an unsaturated bond. Furthermore, the alkyl group may bear a substituent such as an alkoxy group, an aryloxy group, an alkoxycarbonyl group, an aryloxycarbonyl group, an aryl group, a hydroxyl group, or the like. The aryl group may further bear a substituent such as an alkyl group, an alkoxy group, or a halogen atom.

Among the substituents listed above, the alkylene group may be a straight-chain alkylene group or a branched alkylene group. Further, the alkylene group may contain an unsaturated bond, an oxygen atom, a sulfur atom, or a nitrogen atom. Furthermore, the alkylene group may bear a substituent such as an alkoxy group, a hydroxyl group, an aryloxy group, or an aryl group.

Among the substituents listed above, the arylene group may further bear a substituent such as an alkyl group, an alkoxy group, a halogen atom, or the like.

Among the substituents represented by X, Y, or W, a hydrogen atom, an alkyl group having 1 to 18 carbon atoms, an alkoxy group having 1 to 18 carbon atoms, an aryl group having 6 to 18 carbon atoms, a fluorine atom, a chlorine atom, and a bromine atom are preferable. Among these substituents, a hydrogen atom, an alkyl group having 1 to 12 carbon atoms, an alkoxy group having 1 to 12 carbon atoms, a phenyl group, and a chlorine atom are particularly preferable.

Among the substituents represented by Z, a hydrogen atom, a chlorine atom, a fluorine atom, an alkyl group having 1 to 12 carbon atoms, and an alkoxy group having 1 to 12 carbon atoms are preferable. Among these substituents, a hydrogen atom, a chlorine atom, an alkyl group having 1 to 6 carbon atoms, and an alkoxy group having 1 to 6 carbon atoms are particularly preferable.

Among the substituents represented by R, an alkyl group having 1 to 18 carbon atoms and an aryl group having 6 to 18 carbon atoms are preferable. Among these substituents, an alkyl group having 1 to 12 carbon atoms and an aryl group having 6 to 12 carbon atoms are particularly preferable.

Among the substituents represented by $R_1$ or $R_2$, an alkoxy group having 1 to 12 carbon atoms, an aryloxy group having 6 to 12 carbon atoms, an alkyl group having 1 to 12 carbon atoms, and an aryl group having 6 to 12 carbon atoms are preferable.

Among the substituents represented by $R_3$, a 2-nitrophenyl group, a 3,5-dimethoxyphenyl group, and 3,4,5-trimethoxyphenyl group are preferable.

Among the substituents represented by $R_4$, $R_5$, or $R_6$, an alkyl group having 1 to 12 carbon atoms and an aryl group having 6 to 12 carbon atoms are preferable. Among these substituents, an alkyl group having 1 to 8 carbon atoms and a phenyl group are particularly preferable.

In a so-called bis-structure having two benzotriazole rings in one molecule, an alkylene group having 1 to 12 carbon atoms or an arylene group having 6 to 12 carbon atoms is preferable as the substituent represented by $R_7$ and a hydrogen atom or an alkyl group having 1 to 6 carbon atoms is preferable as the substituent represented by $R_8$.

Among the substituents represented by A, $—SO_2R$ is particularly preferable.

Specific examples of the above-listed substituent are given below, though it should be understood that the present invention is not restricted to these examples.

Among the substituents represented by X, Y, or W, monovalent substituents include a hydrogen atom, a methyl group, an ethyl group, an n-propyl group, an isopropyl group, an n-butyl group, an isobutyl group, a sec-butyl group, a t-butyl group, a pentyl group, a hexyl group, an octyl group, a decyl group, a dodecyl group, an allyl group, a 2-butenyl group, a benzyl group, an α-dimethylbenzyl group, a methoxy group, an ethoxy group, a propyloxy group, a butyloxy group, an octyloxy group, a dodecyloxy group, a methoxyethoxy group, a phenoxyethoxy group, a methoxycarbonylethyl group, an ethoxycarbonylethyl group, a propyloxycarbonylethyl group, a butyloxycarbonylethyl group, an octyloxycarbonylethyl group, a phenoxycarbonylethyl group, a phenyl group, a tolyl group, a chlorine atom, a fluorine atom, a bromine atom, and so on. Bivalent substituents include the groups given below.

X: $—CH_2—$, $—CH_2—CH_2—$, $—O—CH_2—CH_2—O—$, $—O—(CH_2)_8—O—$

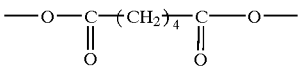

W: $—O—(CH_2)_6O—$,

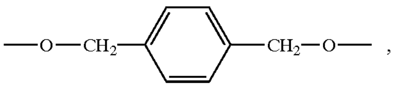

$—O—(CH_2)_2O—(CH_2)_2O—$, $—O—(CH_2)_2S—(CH_2)_2O—$

Y:

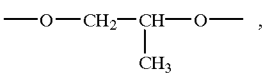

$—CH_2CH_2—CO_2—CH_2)_4OCO—CH_2—CH_2—$, $—CH_2—CH_2—CO_2—CH_2—CH_2—O—CH_2—CH_2—O—CO—CH_2—CH_2—$, $—CH_2—CH_2—OCO(CH_2)_8CO_2—CH_2—CH_2—$, $—CH_1—CH_2—CONH(CH_2)_6NHCO—CH_2—CH_2—$

Specific examples of the substituents represented by Z include a hydrogen atom, a chlorine atom, a methyl group, an ethyl group, a propyl group, a hexyl group, a methoxy group, an ethoxy group, a propyloxy group, and an octyloxy group.

Specific examples of the monovalent substituents represented by A include a methanesulfonyl group, an ethanesulfonyl group, a butanesulfonyl group, a benzenesulfonyl group, a 4-methylbenzenesulfonyl group, a 2-mesitylenesulfonyl group, a 4-methoxybenzenesulfonyl group, a 4-octyloxybenzenesulfonyl group, a 2,4,6-triisopropylbenzenesulfonyl group, a β-styrenesulfonyl group, a vinylbenzenesulfonyl group, a 4-chlorobenzenesulfonyl group, a 2,5-dichlorobenzenesulfonyl group, a 2,4,5-trichlorobenzenesulfonyl group, a 1-naphthalenesulfonyl group, a 2-naphthalenesulfonyl group, a quinolinesulfonyl group, a thiophenesulfonyl group, an acetyl group, a propionyl group, a butyryl group, a pivaloyl group, a lauroyl group, a stearoyl group, a benzoyl group, a cinnamoyl group, a furoyl group, a nicotinoyl group, a methoxycarbonyl group, an ethoxycarbonyl group, a phenoxycarbonyl group, a hexylaminocarbonyl group, a phenylaminocarbonyl group, a diphenylphosphoryl group, a diethylphosphoryl group, a 2-nitrobenzyl group, a 3,5-dimethoxybenzyl group, a 3,4,5-trimethoxybenzyl group, a trimethylsilyl group, a triethylsilyl group, a t-butyldimethylsilyl group, a diethylisopropylsilyl group, a dimethylphenylsilyl group, a diphenylmethylsilyl group, and a triphenylsilyl group. Specific examples of the bivalent substituents represented by A include the following groups.

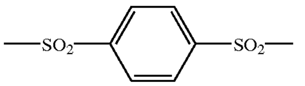

$—CO—(CH_2)_a CO—$, $—SO—$, $—SO_2—$

In the case where A is $—SiR_4R_5R_6$, a photoacid generating agent such as an ammonium salt, a diazonium salt, an iodonium salt, a sulfonium salt, a phosphonium salt, or an onium salt may also be used at the same time in order to enhance photoreactivity. Details of the specific examples of these photoacid generating agents are described in "Organic Materials for Imaging" edited by Research Association of Organoelectronics Materials, 1993.

Specific examples (Specific Examples (1) to (49)) of the compounds represented by the general formulae (1) to (4) are given below, though it should be understood that the present invention is not restricted to these examples.

TABLE 1

In a case where m is 1 in the general formula (1)

| Specific Examples | A | X | W | Y | Z |
|---|---|---|---|---|---|
| (1) | 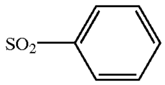 | H | H | $CH_3$ | H |
| (2) | 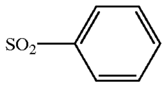 | " | " | $C_4H_9$(t) | " |
| (3) | 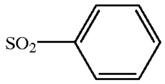 | " | " | $C_8H_{17}$(t) | " |
| (4) | 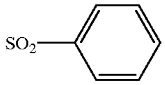 | " | " | $C_4H_9$(t) | Cl |
| (5) | 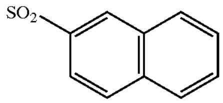 | " | " | " | H |
| (6) | 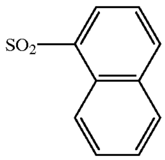 | " | " | " | " |
| (7) | 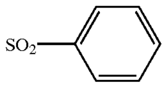 | $C_4H_9$ (sec) | " | $C_4H_9$(t) | H |
| (8) | 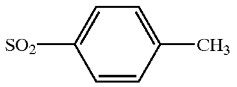 | $C_4H_9$ (sec) | " | " | " |

TABLE 1-continued
In a case where m is 1 in the general formula (1)
| Specific Examples | A | X | W | Y | Z |
|---|---|---|---|---|---|
| (9) | 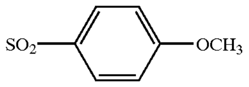 | $C_4H_9$ (sec) | " | " | " |
| (10) | 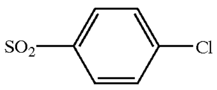 | $C_4H_9$ (sec) | " | " | " |
| (11) | 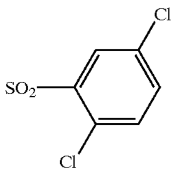 | $C_4H_9$ (sec) | " | " | " |
| (12) | 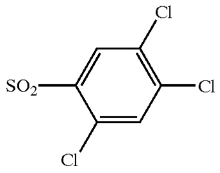 | $C_4H_9$ (sec) | " | " | " |
| (13) | 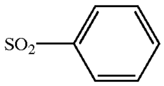 | $C_4H_9$(t) | " | " | H |
| (14) | 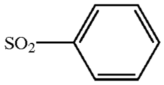 | " | " | " | Cl |
| (15) | 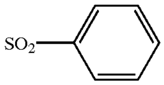 | " | " | " | $CH_3$ |
TABLE 2
In a case where m is 1 in the general formula (1)
| Specific Examples | A | X | W | Y | Z |
|---|---|---|---|---|---|
| (16) | 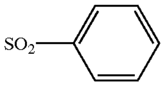 | $C_5H_{11}$(t) | H | $C_5H_{11}$(t) | H |
| (17) | 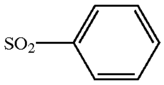 | $C_{12}H_{25}$ | H | $CH_2$ | H |
| (18) | 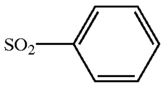 | H | $OC_5H_{17}$ | H | H |
| (19) | 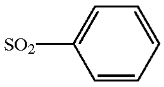 | H | H | $OCH_3$ | H |
| (20) | 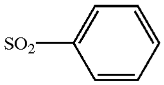 | $C_4H_9$(t) | H | $CH_2CH_2CO_2CH_2$ | H |
| (21) | 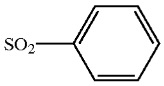 | " | " | $CH_2CH_2CO_2C_2H_5$ | Cl |
| (22) | 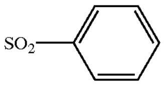 | " | " | $CH_2CH_2CO_2C_2H_7$ | " |

TABLE 2-continued
| In a case where m is 1 in the general formula (1) | | | | | |
|---|---|---|---|---|---|
| Specific Examples | A | X | W | Y | Z |
| (23) | 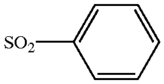 | " | " | $CH_2CH_2CO_2C_8H_{17}$ | " |
| (24) | 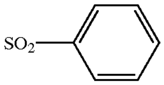 | " | " | $CH_3$ | " |
| (25) | 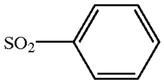 | $CH_2CH{=}CH_2$ | " | $C_4H_9$(t) | H |
| (26) | 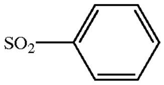 | " | " | $C_4H_9$(t) | Cl |
| (27) | 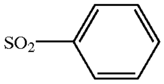 | " | " | $C_8H_{17}$(t) | H |
| (28) | $COCH_3$ | H | H | $C_4H_9$(t) | " |
| (29) | 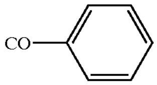 | $C_4H_9$(t) | H | $C_4H_9$(t) | Cl |
| (30) | $CO_2CH_3$ | 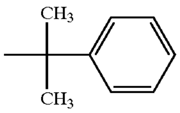 | H | 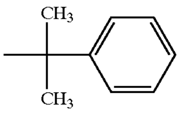 | H |
TABLE 3
| In a case where m is 1 in the general formula (1) | | | | | |
|---|---|---|---|---|---|
| Specific Examples | A | X | W | Y | Z |
| (31) | $CO_2C_2H_5$ | $C_4H_9$(t) | H | $C_4H_9$(t) | $OCH_3$ |
| (32) | 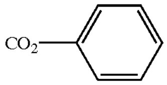 | $C_4H_9$(t) | H | $CH_2CH_2CO_2C_3H_{13}$ | H |
| (33) | 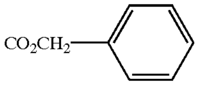 | $C_5H_{11}$(t) | H | $C_5H_{11}$(t) | H |
| (34) | 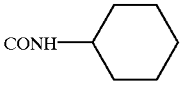 | " | " | " | " |
| (35) | 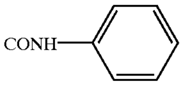 | " | " | " | " |
| (36) | $PO(OC_2H_5)_2$ | " | " | " | " |

TABLE 3-continued
In a case where m is 1 in the general formula (1)
| Specific Examples | A | X | W | Y | Z |
|---|---|---|---|---|---|
| (37) | 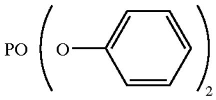 | " | " | " | " |
| (38) | 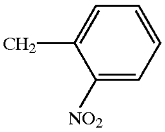 | " | " | " | " |
| (39) | 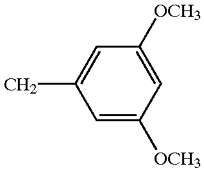 | " | " | " | " |
| (40) | $Si(CH_3)_3$ | $C_4H_9$(sec) | " | $C_4H_9$(t) | " |
| (41) | $Si(C_2H_5)_3$ | " | " | " | " |
| (42) | $Si(CH_3)_2C_4H_9$(t) | " | " | " | " |
| (43) | 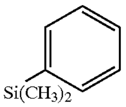 | " | " | " | " |
| (44) | 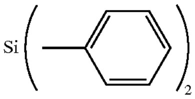 | H | H | " | " |
| (45) | $Si(CH_3)_3$ | $C_4H_9$(t) | H | " | " |
In a case where m is 2 in the general formula (1)
Specific Example (46)
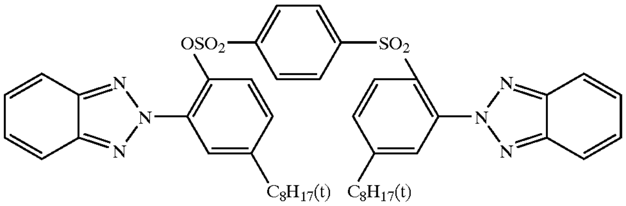
Specific Example (47)
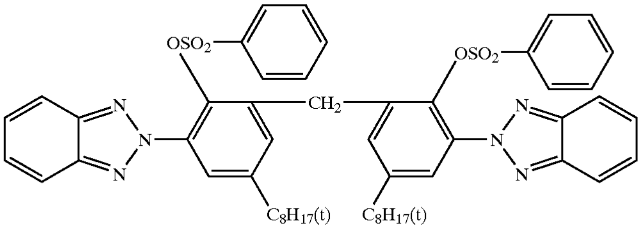

-continued

Specific Example (48)

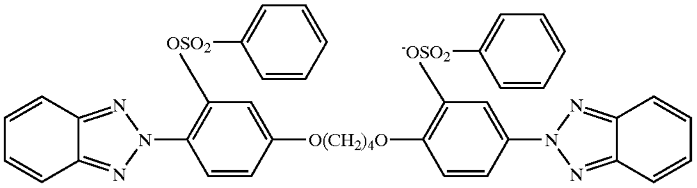

Specific Example (49)

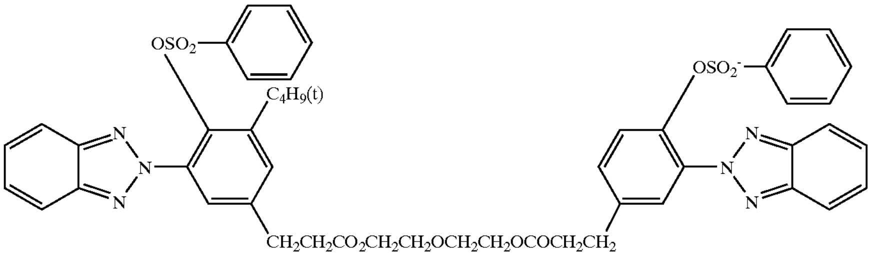

When the heat-sensitive recording material is fixed, the compounds represented by the general formulae (1) to (4) do not absorb the fixing light. And, these compounds can enhance light stability of images by absorbing ultraviolet light having longer wavelengths after images are formed.

In the present invention, the compounds represented by the general formulae (1) to (4) can be easily synthesized by conventionally known methods.

In the present invention, in order to inhibit stain formation due to a byproduct that is formed when an ultraviolet light absorber is formed after the compounds represented by the general formulae (1) to (4) react due to the effect of light or heat, preferably a compound represented by the following general formula (5) is also used at the same time. The compound represented by the general formula (5) is a so-called radical trapping agent. If this compound is used, the stain formation can be inhibited.

General formula (5)

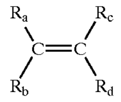

In the general formula (5), $R_a$ to $R_d$ each represents a hydrogen atom, an alkyl group, an alkoxy group, an ester group, an aryl group, or a halogen atom. Among these substituents, the alkyl group may be a straight-chain alkyl group or a branched alkyl group. Further, the alkyl group may have an unsaturated bond. Furthermore, the alkyl group may bear a substituent such as an alkoxy group, an aryloxy group, an alkoxycarbonyl group, an aryl group, a hydroxyl group, or the like.

Among the substituents represented by $R_a$, a hydrogen atom is preferable. Among the substituents represented by $R_b$, a hydrogen atom is preferable. Among the substituents represented by $R_c$, a hydrogen atom, an alkyl group, and an aryl group are preferable. Among the substituents represented by $R_d$. an ester group, an alkyl group, and an aryl group are preferable.

The compound represented by the general formula (5) may be a polar compound or a nonpolar compound. A nonpolar compound is preferable in view of suitability to encapsulation into microcapsules.

Specific examples of the compounds represented by the general formula (5) are given below, though it should be understood that the present invention is not restricted to these examples.

Specific examples of the compounds represented by the general formula (5) include the following structural formula (A), styrene and polymeric oligomers thereof, and the following (A-1 to A-107). Among these, the structural formula (A) and an α-methylstyrene dimer are preferable. The structural formula (A) is more preferable from the standpoint of molecular weight and viscosity.

Structural Formula (A)

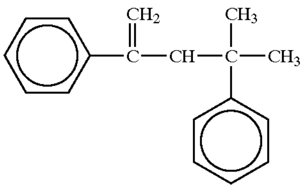

A-1

isoamyl acrylate

A-2

$CH_2{=}CHCOOC_{12}H_{25}$ lauryl acrylate

A-3

$CH_2{=}CHCOOC_{18}H_{37}$ stearyl acrylate

A-4

$CH_2{=}CHCOOCH_2CH_2OC_4H_9$ butoxyethyl acrylate

A-5

$CH_2{=}CHCOO(CH_2CH_2O)_2C_2H_5$ ethoxydiethylene glycol acrylate

A-6

$CH_2{=}CHCOO(CH_2CH_2O)_3CH_3$ methoxytriethylene glycol acrylate

A-7

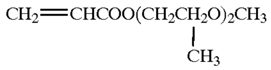

methoxydipropylene glycol acrylate

-continued

A-8

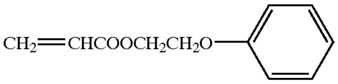

phenoxyethyl acrylate

A-9

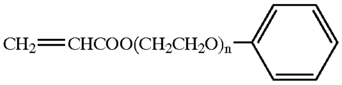

pehnoxypolyethylene glycol acrylate n~2

A-10

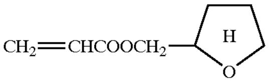

tetrahydrofurfuryl acrylate

A-11

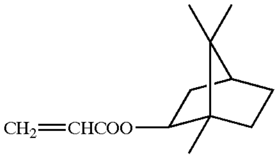

isobornyl acrylate

A-12

$CH_2{=}CHCOOCH_2CH_2OH$ 2-hydroxyethyl acrylate

A-13

2-hydroxypropyl acrylate

A-14

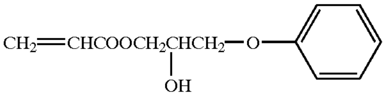

2-hydroxy-3-phenoxypropyl acrylate

A-15

$CH_2{=}CHCOOCH_2CH_2OCOCH_2CH_2{-}COOH$ 2-acryloyloxyethyl succinate

A-16

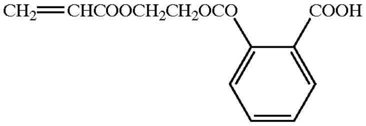

2-acryloyloxyethyl phthalate

A-17

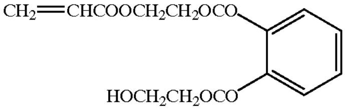

2-acryloyloxyethyl-2-hydroxyethyl phthalate

A-18

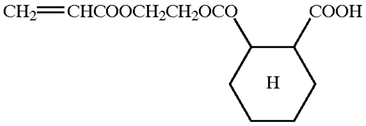

2-acryloyloxyethyl hexahydrophthalate

A-19

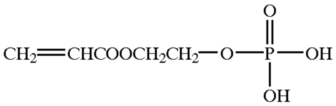

2-acryloyloxyethyl acid phosphate

-continued

A-20

$CH_2{=}CHCOO(CH_2CH_2O)_3{-}COCH{=}CH_2$ triethylene glycol diacrylate

A-21

$CH_2{=}CHCOO(CH_2CH_2O)_n{-}COCH{=}CH_2$

PEG No. 200 diacrylate n = 4

A-22

$CH_2{=}CHCOO(CH_2CH_2O)_n{-}COCH{=}CH_2$

PEG No. 400 diacrylate n = 9

A-23

$CH_2{=}CHCOO(CH_2CH_2O)_n{-}COCH{=}CH_2$

PEG No. 600 diacrylate n = 14

A-24

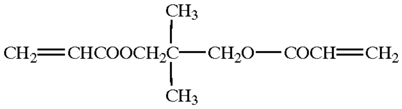

neopentyl glycol diacrylate

A-25

$CH_2{=}CHCOO(CH_2)_6OCOCH{-}CH_2$ 1,6-hexanediol diacrylate

A-26

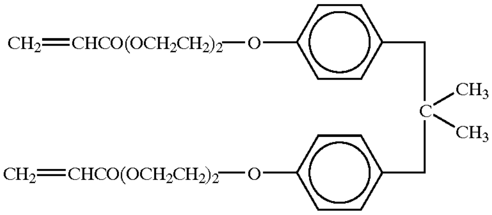

EO - modified bisphenol A diacrylate

A-27

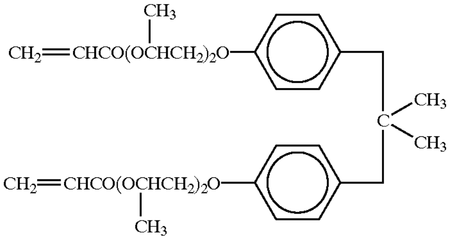

PO - modified bisphenol A diacrylate

A-28

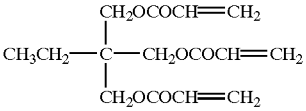

trimethylolpropane triacrylate

A-29

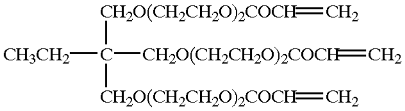

EO - modified trimethylolpropane triacrylate

A-30

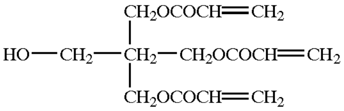

pentaerythritol triacrylate

-continued

A-31

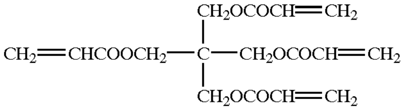

pentaerythritol tetraacrylate

A-32

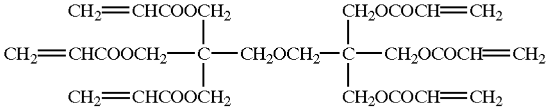

dipentaerythritol hexaacrylate

A-33

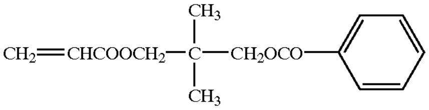

(main component)
ester of neopentyl glycol, acrylate and benzoate

A-34

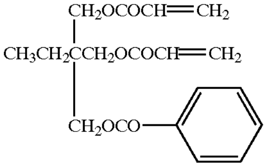

(main component)
ester of trimethylolpropane, acrylate and benzoate

A-35

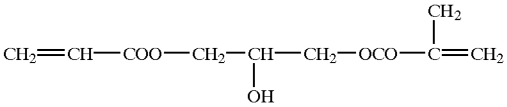

3-acryloyloxyglycerin monomethacrylate

A-36

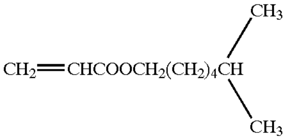

isooctyl acrylate

A-37

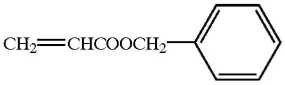

benzyl acrylate

A-38

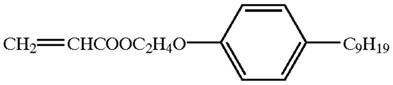

A-39

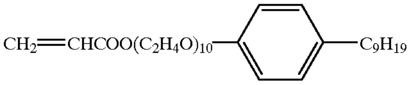

A-40

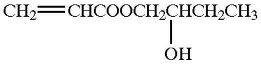

2-hydroxybutyl acrylate

A-41

$CH_2{=}CHCOOCH_2CH_2{-}C_8F_{17}$ perfluorooctylethyl acrylate

-continued

A-42

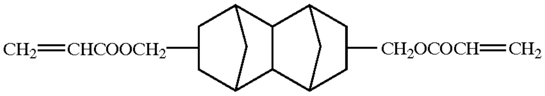

hydrogenated cyclopentadienyl diacrylate

A-43

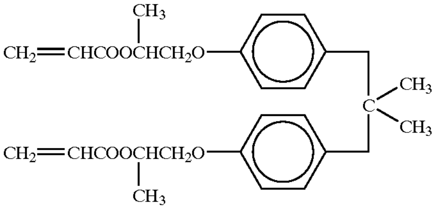

PO - modified bisphenol A diacrylate

A-44

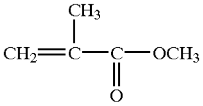

methyl methacrylate

A-45

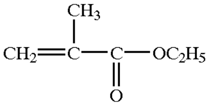

ethyl methacrylate

A-46

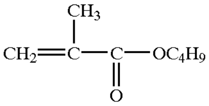

n-butyl methacrylate

A-47

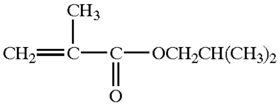

isobutyl methacrylate

A-48

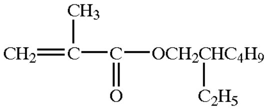

2-ethylhexyl methacrylate

A-49

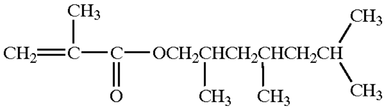

isodecyl methacrylate

A-50

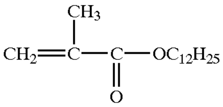

n-lauryl methacrylate

A-51

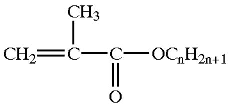

alkyl ($C_{12-13}$) methacrylate n = 12 ~ 13

-continued

A-52

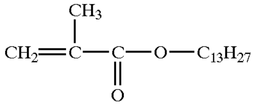

dodecyl methacrylate

A-53

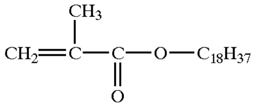

n-stearyl methacrylate

A-54

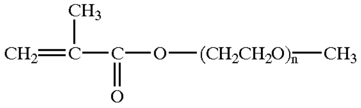

methoxypolyethylene glycol methacrylate n = 9

A-55

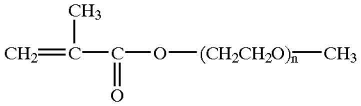

methoxypolyethylene glycol methacrylate n = 30

A-56

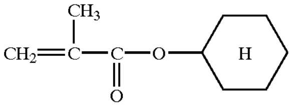

cyclohexyl methacrylate

A-57

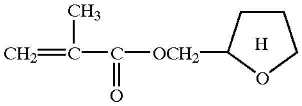

tetrahydrofurfuryl methacrylate

A-58

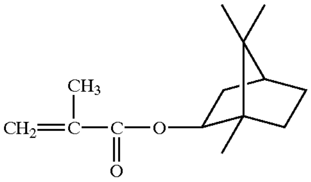

isobornyl methacrylate

A-59

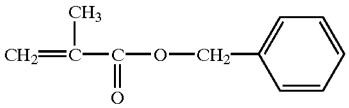

benzyl methacrylate

A-60

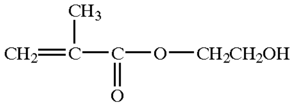

2-hydroxyethyl methacrylate

A-61

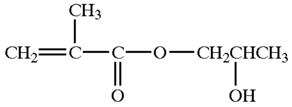

2-hydroxypropyl methacrylate

-continued

A-62

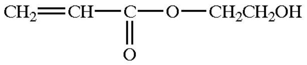

2-hydroxyethyl acrylate

A-63

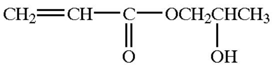

2-hydroxpropyl acrylate

A-64

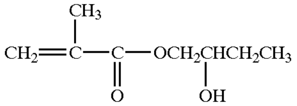

2-hydroxbutyl methacrylate

A-65

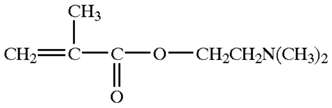

dimethylaminoethyl methacrylate

A-66

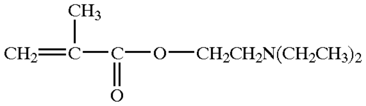

diethylaminoethyl methacrylate

A-67

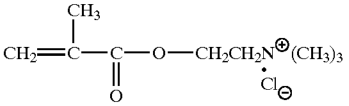

quarternized dimethylaminoethyl methacrylate

A-68

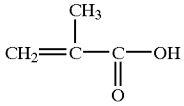

methacrylic acid

A-69

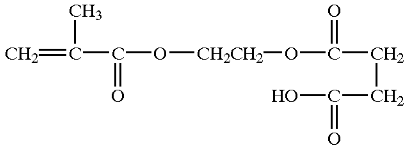

2-methacryloyloxyethyl succinate

A-70

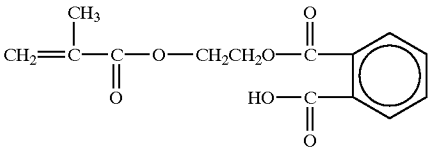

2-methacryloyloxyethyl phthalate

A-71

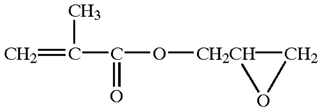

glycidyl methacrylate

A-72

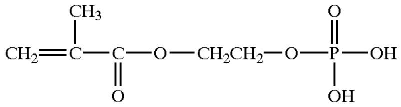

mono(2-methacryloyloxyethyl) acid phosphate

-continued

A-73

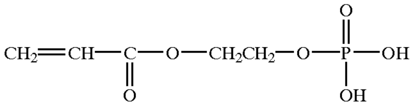

mono(2-acryloyloxyethyl) acid phosphate

A-74

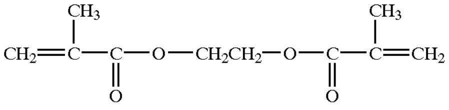

ethylene glycol dimethacrylate

A-75

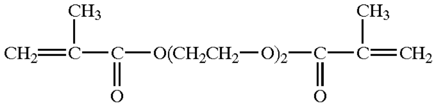

diethylene glycol dimethacrylate

A-76

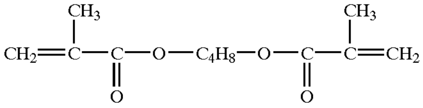

1,4-butanediol dimethacrylate

A-77

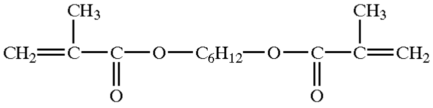

1,6-hexanediol dimethacrylate

A-78

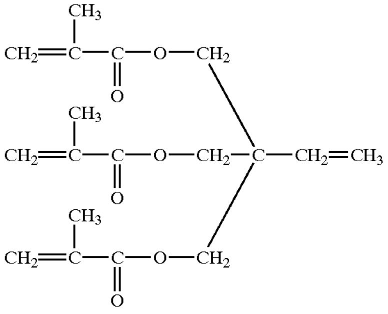

trimethylolpropane trimethacrylate

A-79

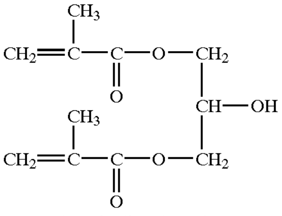

glycerin dimethacrylate

A-80

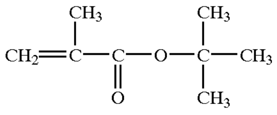

t-butyl methacrylate

A-81

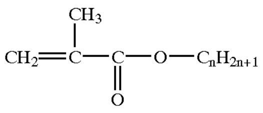

alkyl ($C_{12-15}$) methacrylate n = 12 ~ 15

-continued

A-82

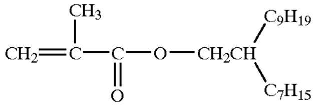

iso-stearyl methacrylate

A-83

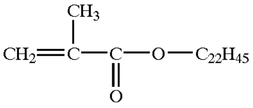

behenyl methacrylate

A-84

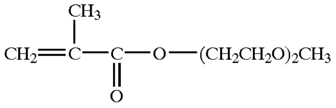

methoxydiethylene glycol methacrylate

A-85

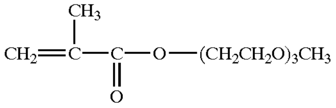

methoxytriethylene glycol methacrylate

A-86

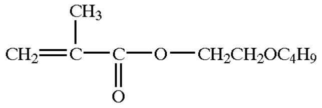

n-butoxyethyl methacrylate

A-87

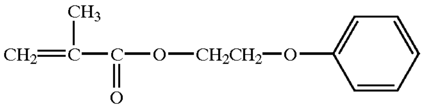

2-phenoxyethyl methacrylate

A-88

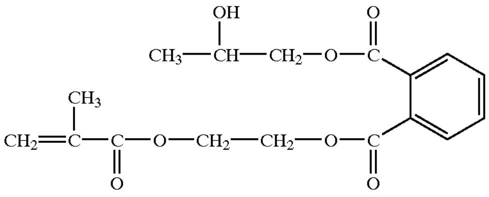

2-methacryloyloxyethyl•2-hydroxypropyl phthalate

A-89

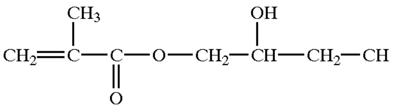

glycerol monomethacrylate

A-90

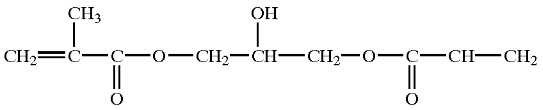

2-hydroxy-3-acryloyloxypropyl methacrylate

A-91

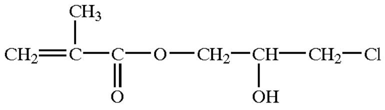

3-chloro-2-hydroxypropyl methacrylate

-continued

A-92

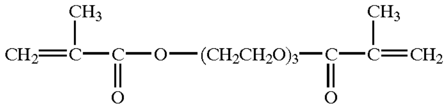

triethylene glycol dimethacrylate

A-93

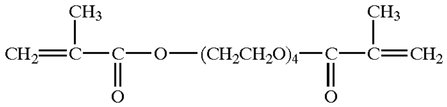

PEG No. 200 dimethacrylate

A-94

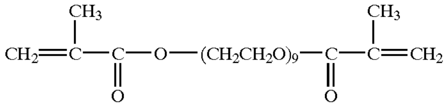

PEG No. 400 dimethacrylate

A-95

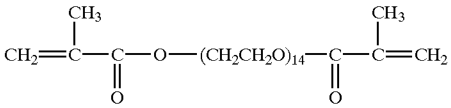

PEG No. 600 dimethacrylate

A-96

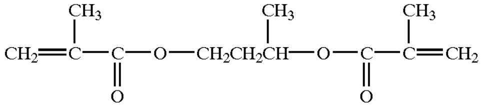

1,3-butanediol dimethacrylate

A-97

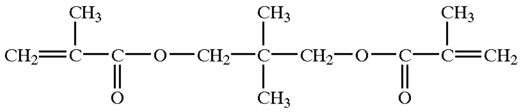

neopentyl glycol dimethacrylate

A-98

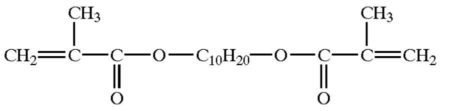

1,10-decanediol dimethacrylate

A-99

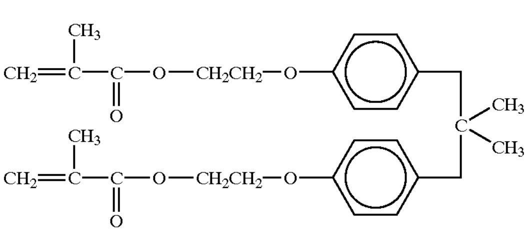

A-100

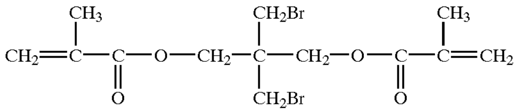

dibromoneopentyl glycol dimethacrylate

-continued

A-101

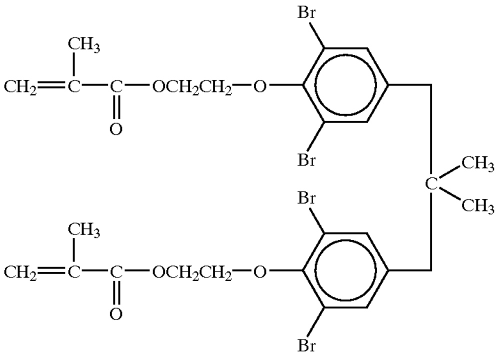

A-102

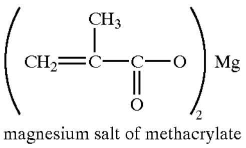

magnesium salt of methacrylate

A-103

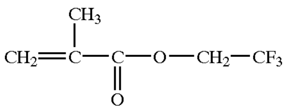

trifluoroethyl methacrylate

A-104

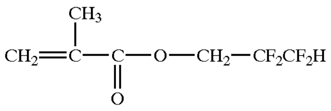

2,2,3,3-tetrafluoropropyl methacrylate

A-105

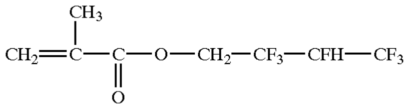

2,2,3,4,4,4-hexaafluorobutyl methacrylate

A-106

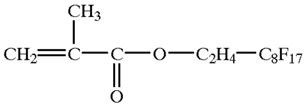

perfluorooctylethyl methacrylate

A-107

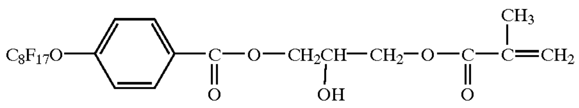

In the present invention, the compounds represented by the general formula (5) can be easily synthesized according to conventionally known methods. On the other hand, commercialized products such as “1A-A”, “L-A”, and “S-A” manufactured by Kyoei Sha Yushi Kagaku Co., Ltd. may be used.

In the present invention, a compound represented by any of the general formulae (1) to (4) may be incorporated in any of the layers constituting the heat-sensitive recording material, or alternatively, may be incorporated in an additional layer such as a light and heat controlling layer. Preferably, a compound represented by any of the general formulae (1) to (4) is incorporated in a protective layer, which is disposed above a color-forming layer, from the standpoint of effectively utilizing the function of the protective layer as a light-shielding layer. More preferably, a light transmittance controlling layer is provided on the heat-sensitive layer side opposite to the support side and a compound represented by any of the general formulae (1) to (4) is incorporated in the light transmittance controlling layer. In the case where a protective layer is present, the light transmittance controlling layer is preferable provided between the heat-sensitive layer and the protective layer, in view of, for example, the function as a light-shielding layer of the light transmittance controlling layer.

In the present invention, the coating weight of the compound represented by any of the general formulae (1) to (4) is preferably 0.05 $g/m^2$ or more and more preferably in the range of 0.1 to 1.5 $g/m^2$. If the coating weight is less than 0.1 $g/m^2$, the lightfastness tends to become inferior because the control of the transmission of light, particularly the reduction of the transmittance of the light within an ultraviolet range after irradiation with light whose wavelength is in a range necessary for fixing, is difficult to perform. On the other hand, the coating weight exceeding 1.5 $g/m^2$is disadvantageously excessive.

The compound represented by any of the general formulae (1) to (4) may be used singly or in a combination of two or more.

In the present invention, the content of the compound represented by the general formula (5) is preferably about 0.05 to 20 times, more preferably 0.1 to 5 times, and most preferably 0.3 to 2 times the content of the compound represented by any of the general formulae (1) to (4). If the content of the compound represented by the general formula (5) is less than 0.3 times, the stain inhibiting effect tends to diminish. On the other hand, if the content of the compound represented by the general formula (5) is more than 2 times, the coating weight increases and the stain inhibiting effect per unit content tends to diminish.

The compound represented by the general formula (5) may be used singly or in a combination of two or more.

In the present invention, the compound represented by any of the general formulae (1) to (4) and the hydrogen donor are incorporated into the heat-sensitive recording material according to any of the following methods. That is, (1) a method in which the compound and the hydrogen donor are used as a dispersion of solid particles; (2) a method in which the compound and the hydrogen donor are used as an emulsified dispersion; (3) a method in which the compound and the hydrogen donor are used as a polymer dispersion; (4) a method in which the compound and the hydrogen donor are used as a latex dispersion; and (5) a method in which the compound and the hydrogen donor are used after being encapsulated in microcapsules. Among these methods, (2) a method in which the compound and the hydrogen donor are used as an emulsified dispersion and (5) a method in which the compound and the hydrogen donor are used after being encapsulated in microcapsules are preferable. From the viewpoint of the prevention of the diffusion of the ultraviolet light absorber precursor, (5) a method in which the compound and the hydrogen donor are used after being encapsulated in microcapsules is more preferable.

(2) A method in which the compound and the hydrogen donor are used as an emulsified dispersion is as follows. First, the compound represented by any of the general formulae (1) to (4) and the hydrogen donor are dissolved in an oil. The oil may be a solid, a liquid, or a polymer at normal temperatures. Examples of the oil include low-boiling auxiliary solvents such as acetic ester, methylene chloride, and cyclohexanone and/or phosphoric ester, phthalic ester, acrylic ester, methacrylic ester, other carboxylic acid esters, fatty acid amides, alkylated biphenyl, alkylated terphenyl, alkylated naphthalene, diaryl ethane, chlorinated paraffin, alcohols, phenols, ethers, monoolefins, and epoxies. Specific examples include high-boiling oils such as tricresyl phosphate, trioctyl phosphate, octyldiphenyl phosphate, tricyclohexyl phosphate, dibutyl phthalate, dioctyl phthalate, dilauryl phthalate, dicyclohexyl phthalate, butyl oleate, diethylene glycol benzoate, dioctyl sebacate, dibutyl sebacate, dioctyl adipate, trioctyl trimellitate, acetyltriethyl citrate, octyl maleate, dibutyl maleate, isoamylbiphenyl, chlorinated paraffin, diisopropylnaphthalene, 1,1'-ditolylethane, 2,4-di-t-amylphenol, N,N-dibutyl-2-butoxy-5-t-octylaniline, 2-ethylhexyl hydroxybenzoate, and polyethylene glycol. Among these high-boiling oils, alcohols, phosphoric esters, carboxylic acid esters, alkylated biphenyl, alkylated terphenyl, alkylated naphthalene, and diaryl ethane are preferable. Further, a carbonization inhibitor such as a hindered phenol or a hindered amine may be added to these high-boiling oils. In particular, an oil comprising an unsaturated fatty acid is preferable as the oil and examples thereof include an α-methylstyrene dimer. Examples of the α-methylstyrene dimer include MSD100 (trade name, manufactured by Mitsui Toatsu Chemicals, Inc.).

An oil solution containing the compound represented by any of the general formulae (1) to (4) and the hydrogen donor is added into an aqueous solution of a water-soluble polymer, and the mixture is subjected to emulsifying dispersion by means of a colloid mill, homogenizer, or ultrasonic wave. A water-soluble polymer such as polyvinyl alcohol is used as the water-soluble polymer in the above-mentioned process. In this case, a hydrophobic polymer emulsion or latex or the like can be used together with polyvinyl alcohol. Examples of the water-soluble polymer include polyvinyl alcohol, silanol-modified polyvinyl alcohol, carboxy-modified polyvinyl alcohol, amino-modified polyvinyl alcohol, itaconic acid-modified polyvinyl alcohol, styrene/maleic anhydride copolymers, butadiene/maleic anhydride copolymers, ethylene/maleic anhydride copolymers, isobutylene/maleic anhydride copolymers, polyacrylamide, polystyrenesulfonic acid, polyvinyl pyrrolidone, ethylene/acrylic acid copolymers, and gelatin. Among these water-soluble polymers, carboxy-modified polyvinyl alcohol is particularly preferable. Examples of the hydrophobic polymer emulsion or latex include styrene/butadiene copolymers, carboxy-modified styrene/butadiene copolymers, and acrylonitrile/butadiene copolymers. In this case, a conventionally known surfactant or the like may be added as necessary.

(5) As for the method of encapsulation in microcapsules, a conventionally known method of encapsulation in microcapsules can be employed. The method is as follows. The compound represented by any of the general formulae (1) to (4), the hydrogen donor, and a microcapsule wall precursor are dissolved in an organic solvent which is difficultly soluble or insoluble in water. The resulting solution is added into an aqueous solution of a water-soluble polymer; subjected to emulsifying dispersion by means of a homogenizer or the like; and heated so that a wall film of a polymeric substance constituting a microcapsule wall film is formed in the oil/water interface. Specific examples of the polymeric material constituting a microcapsule wall film include a polyurethane resin, a polyurea resin, a polyamide resin, a polyester resin, a polycarbonate resin, an aminoaldehyde resin, a melamine resin, a polystyrene resin, a styrene/ acrylate copolymer resin, a styrene/methacrylate copolymer resin, gelatin, and polyvinyl alcohol. Among these examples, microcapsules having a wall film composed of a polyurethane and/or polyurea resin are particularly preferable.

The microcapsules having a wall film composed of a polyurethane and/or polyurea resin are prepared by the steps of blending a microcapsule wall precursor such as a polyvalent isocyanate into a core material to be encapsulated, subjecting the blend to emulsifying dispersion into an aqueous solution of a water-soluble polymer such as polyvinyl alcohol, and heating the resulting solution so that a polymer forming reaction takes place in the interface of oil droplets.

Some specific examples of the polyvalent isocyanate compound include diisocyanates such as m-phenylene diisocyanate, p-phenylene diisocyanate, 2,6-tolylene diisocyanate, 2,4-tolylene diisocyanate, naphthalene-1,4-diisocyanate, diphenylmethane-4,4'-diisocyanate, 3,3'-diphenylmethane-4,4'-diisocyanate, xylylene-1,4-diisocyanate, 4,4'-diphenylpropane diisocyanate, trimethylene diisocyanate, hexamethylene diisocyanate, propylene-1,2-diisocyanate, butylene-1,2-diisocyanate, cyclohexylene-1,2-diisocyanate, cyclohexylene-1,4-diisocyanate, 3,3'-dimethoxy-biphenyl diisocyanate, xylylene-1,3-diisocyanate, 4-chloroxylylene-1,3-diisocyanate, 2-methylxylylene-1,3-diisocyanate, cyclohexylene-1,3-diisocyanate, 1,4-bis(isocyanatomethyl) cyclohexane, and 1,3-bis(isocyanatomethyl)cyclohexane; triisocyanates such as 4,4',4''-triphenylmethane triisocyanate and toluene-2,4,6-triisocyanate; tetraisocyanates such as 4,4'-dimethyldiphenylmethane-2,2',5,5'-tetraisocyanate; and isocyanate prepolymers such as a hexamethylene diisocyanate/trimethylol propane adduct, a 2,4-tolylene diisocyanate/trimethylol propane adduct, a xylylene diisocyanate/trimethylol propane adduct, and a tolylene diisocyanate/hexanetriol adduct. If necessary, two or more kinds of the polyvalent isocyanate compounds can be used. Among these polyvalent isocyanate compounds, a compound having three or more isocyanate groups in the molecule is particularly preferable.

In the method of encapsulation, as for the organic solvents for dissolving the compound represented by any of the general formulae (1) to (4) and the hydrogen donor, the oils illustrated for use in the emulsifying dispersion can be used. Specific examples of the organic solvent include tricresyl phosphate, trioctyl phosphate, dioctylphthalate, dioctyl sebacate, dioctyl adipate, dibutyl maleate, and O-methylstyrene dimer.

Examples of the water-soluble polymer include polyvinyl alcohol, modified polyvinyl alcohol, methyl cellulose, sodium polystyrenesulfonate, styrene/maleic acid copolymers, gelatin or gelatin derivatives, and polyethylene glycol or polyethylene glycol derivatives.

The particle diameter of the microcapsule is preferably 0.05 to 1.0 $\mu$m and more preferably 0.1 to 0.7 $\mu$m.

In the method of encapsulation into microcapsules, either the compound represented by any of the general formulae (1) to (4) or the hydrogen donor may be encapsulated or both of the compound represented by any of the general formulae (1) to (4) and the hydrogen donor may be encapsulated. Preferably, both of the compound represented by any of the general formulae (1) to (4) and the hydrogen donor are encapsulated. More preferably, both of the compound represented by any of the general formulae (1) to (4) and the hydrogen donor are enclosed in the same capsule.

In the present invention, in order to lessen the coloration due to browning by light, a compound known as a reducing agent can be used together with the compound represented by any of the general formulae (1) to (4) and the hydrogen donor. Although the reducing agent may be present inside or outside the microcapsule, the reducing agent is preferably present inside the microcapsule. In the case where the reducing agent is present outside the microcapsule, a compound, which penetrates into the microcapsule at the time of heat printing, is used as the reducing agent. Examples of the reducing agent include hydroquinone compounds, hydrazide compounds, hydroxy compounds, phenidone compounds, catechol compounds, resorcinol compounds, hydroxyhydroquinone compounds, pyrrologlycinol compounds, phenol compounds, phenylhydrazide compounds, gallic acid compounds, ascorbic acid compounds, and ethylene glycol compounds. These are described in JP-A Nos.3-191341, 3-25434, 1-252953, 2-302753, 1-129247, 1-227145, 1-243048, 2-262649, etc. Specific examples thereof include N-phenylacetohydrazide, N-phenylbutylylhydrazide, p-t-butylphenol, 2-azidebenzoxazole, and the following compounds.

R-1

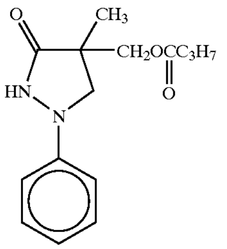

R-2

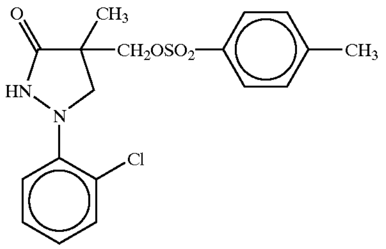

R-3

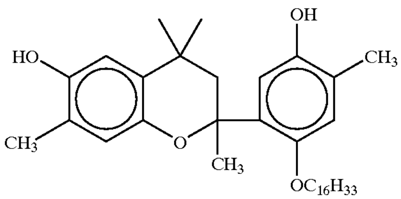

R-4

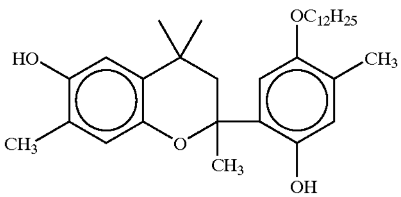

R-5

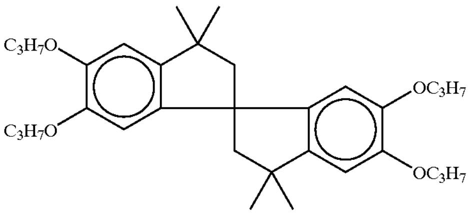

-continued

R-6

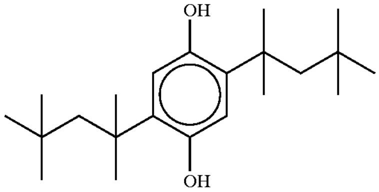

R-7

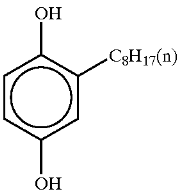

R-8

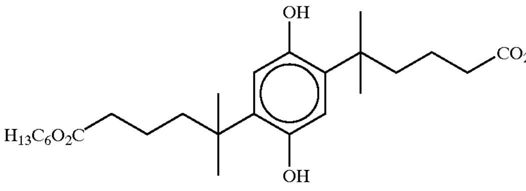

R-9

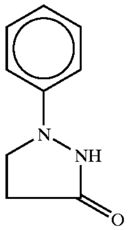

R-10

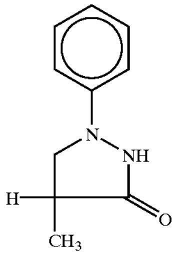

R-11

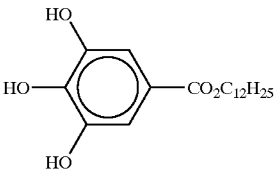

R-12

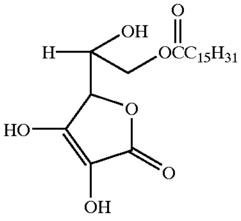

R-13

$CH_3-(OCH_2CH_2)_3-OCH_3$

-continued

R-14

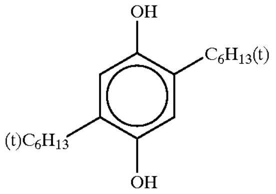

R-15

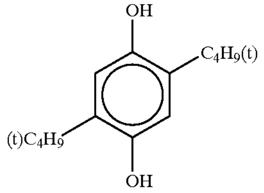

In the present invention, the heat-sensitive recording material preferably comprises a support, a photo-fixing type heat-sensitive recording layer, and optional layers such as an interlayer and a protective layer, each provided on the support. It is also possible to provide another layer containing a compound described in JP-A Nos.7-276808, 9-1928, 9-39395, 9-39396, 9-95487, 9-301958, 11-291629, 6-191155, and 12-206644.

In the present invention, preferably the heat-sensitive recording material has a photo-fixing type heat-sensitive recording layer containing a diazonium salt compound whose maximum absorption wavelength is 365±40 nm and a coupler which reacts with the diazonium salt compound to develop a color and a photo-fixing type heat-sensitive recording layer containing a diazonium salt compound whose maximum absorption wavelength is 425±40 nm and a coupler which reacts with the diazonium salt compound to develop a color.

The present invention may also be a heat-sensitive recording material comprising a support having disposed thereon a photo-fixing type heat-sensitive recording layer containing a diazonium salt compound whose maximum absorption wavelength is 425±40 nm and a coupler which reacts with the diazonium salt compound to develop a color and a photo-fixing type heat-sensitive recording layer containing a diazonium salt compound whose maximum absorption wavelength is 365±40 nm and a coupler which reacts with the diazonium salt compound to develop a color, in the order listed.

Further, the present invention may also be a heat-sensitive recording material having a photo-fixing type heat-sensitive recording layer containing a diazonium salt compound whose maximum absorption wavelength is less than 380 nm and a coupler which reacts with the diazonium salt compound to develop a color and a photo-fixing type heat-sensitive recording layer containing a diazonium salt compound whose maximum absorption wavelength is more than 390 nm and a coupler which reacts with the diazonium salt compound to develop a color.

If a plurality of photo-fixing type heat-sensitive recording layers are present, a multicolor heat-sensitive recording material can be obtained by causing the photo-fixing type heat-sensitive recording layers to develop different colors. That is, full-color image recording is possible by selecting the colors to be developed by the photo-fixing type heat-sensitive recording layers such that these colors constitute the three primary colors for subtractive color mixing, i.e., yellow, magenta, and cyan, respectively. In this case, the color developing mechanism of the photo-fixing type heat-sensitive recording layer (the lowermost layer of the photo-fixing type heat-sensitive recording layers) in direct contact with the support is not limited to the combination of an electron-donating dye and an electron-accepting dye. Accordingly, the combination may be, for example, any of the following systems, i.e., a diazo coloration system consisting of a diazonium salt and a coupler which undergoes a color-forming reaction with the diazonium salt; a base-coloration system in which contact with a basic compound develops a color; a color-forming system by chelating; and a color-forming system in which an elimination reaction with a nucleophilic agent causes color formation. It is preferable to provide, on this photo-fixing type heat-sensitive recording layer, two or more photo-fixing type heat-sensitive recording layers each containing a diazonium salt compound having a different maximum absorption wavelength and a coupler which reacts with the diazonium salt compound to develop a color and to superpose on the layers, a layer (light-transmittance controlling layer) containing the compound represented by any of the general formulae (1) to (4) and a protective layer, in the order listed.

The color-forming components to be used in the photo-fixing type heat-sensitive recording layers in the present invention may be conventionally known ones. Particularly preferable are the color-forming components utilizing the reaction between a diazonium salt compound and a coupler, and the color-forming components utilizing the reaction between an electron-donating colorless dye and an electron-accepting compound. Examples of the compounds which are used in the photo-fixing type heat-sensitive recording layer containing a diazonium salt compound and a coupler which reacts with the diazonium salt compound to develop a color when heated, include a diazonium salt compound, a coupler capable of reacting with the diazonium salt to develop a color, and a basic compound which accelerates the reaction between the diazonium salt compound and the coupler. Details of the diazonium salt compound, coupler, and base are described in, for example, JP-B Nos.4-75147, 6-55546, and 6-79867, JP-A Nos.4-201483, 60-49991, 60-242094, 61-5983, 63-87125, 4-59287, 5-185717,7-88356, 7-96671, 8-324129, 9-38389, 5-185736, 5-8544, 59-190866, 62-55190, 60-6493, 60-259492, 63-318546, 4-65291, 5-204089, 8-310133, 8-324129, 9-156229, and 9-175017. Specific examples of the compounds are given below, though it should be understood that the present invention is not restricted to these examples.

(Specific Examples of the Diazonium Salt Compound)

(A-1)

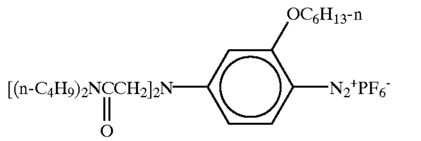

(A-2)

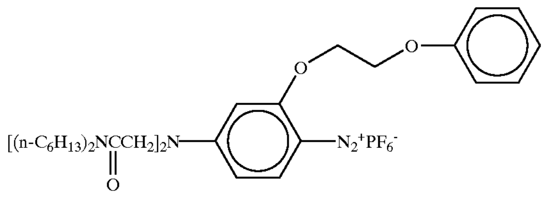

-continued (A-3)

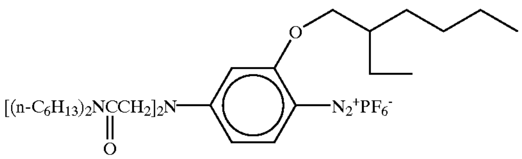

(A-4)

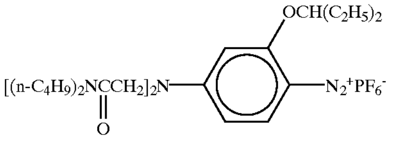

(A-5)

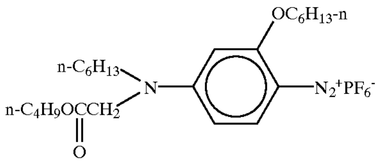

(A-6)

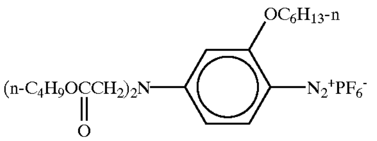

(A-7)

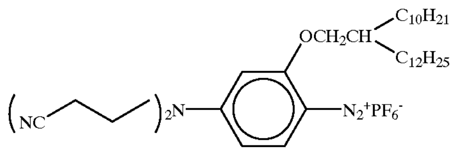

(A-8)

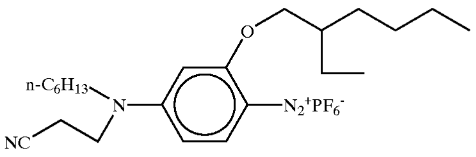

(A-9)

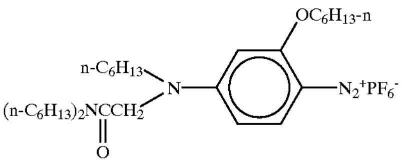

(A-10)

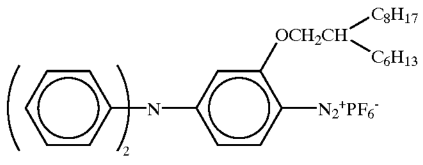

(A-11)

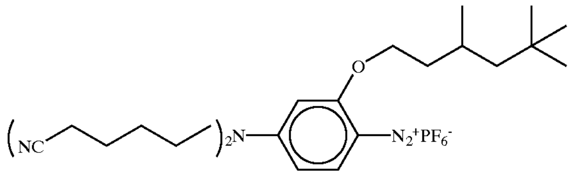

-continued
(A-12)
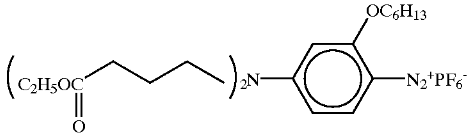
(A-13)
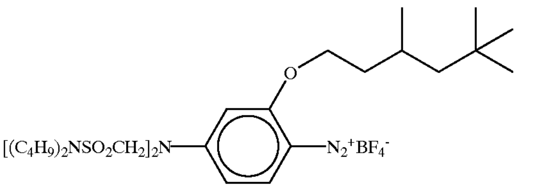
(A-14)
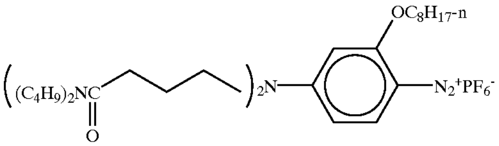
(A-15)
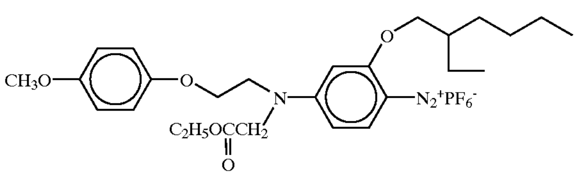
(A-16)
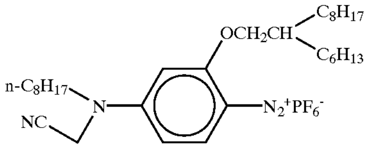
(A-17)
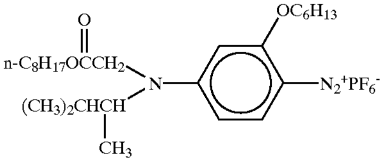
(A-18)
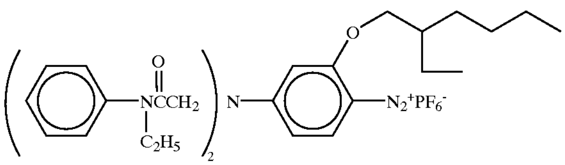
(A-19)
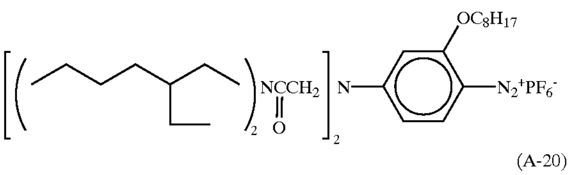
(A-20)
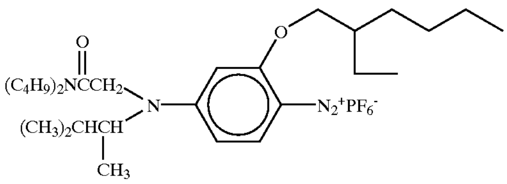
-continued
(A-21)
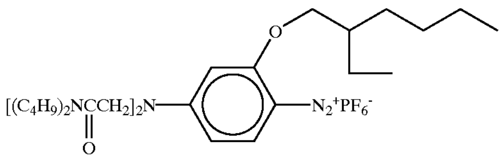
(A-22)
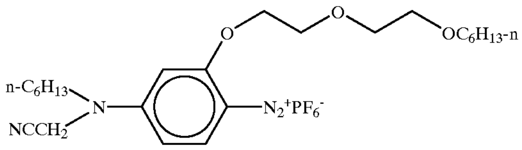
(A-23)
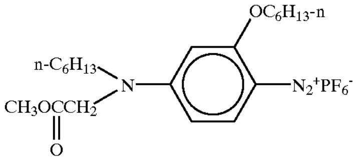
(A)
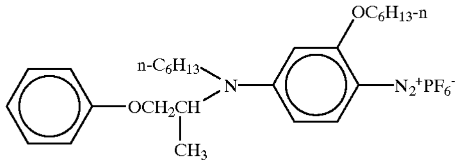
(B)
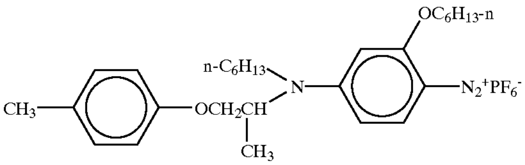
(C)
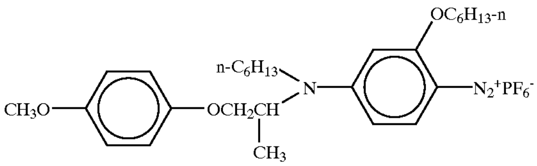
(D)
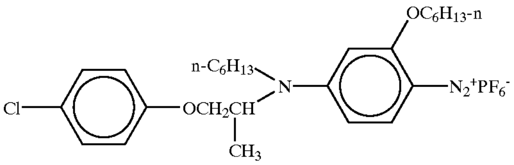
(E)
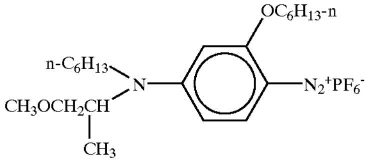
(F)
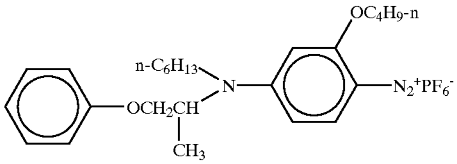

-continued
(G)
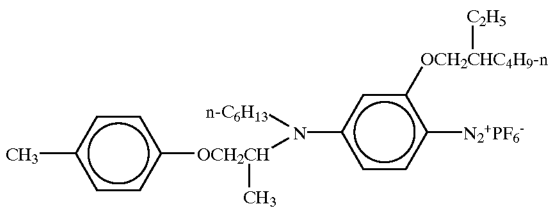
(H)
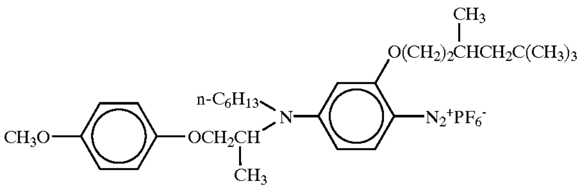
(I)
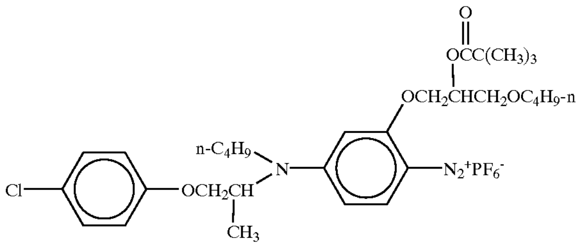
(J)
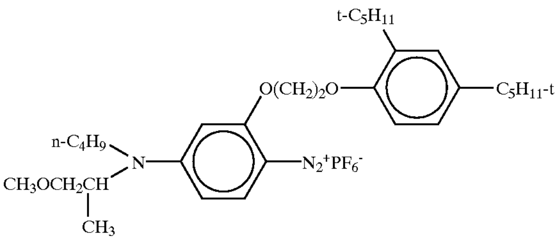
(K)
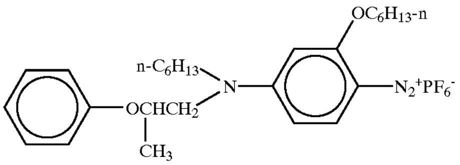
(L)
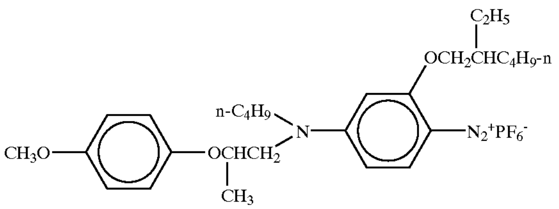
(M)
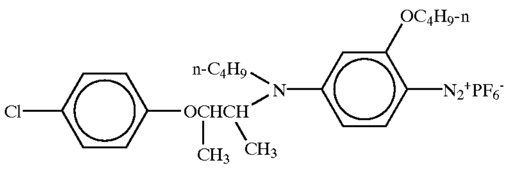
-continued
(N)
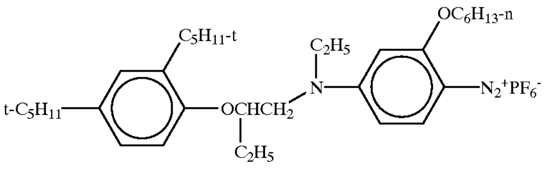
(O)
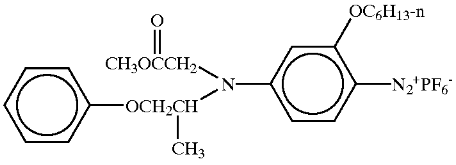
(P)
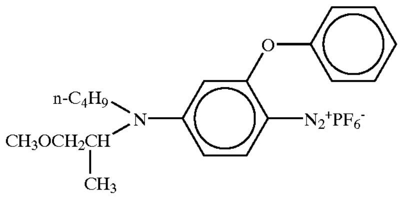
(Q)
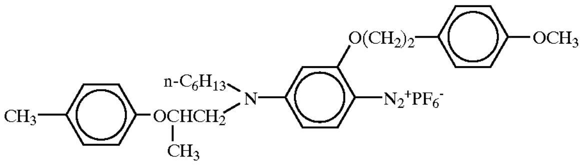
(R)
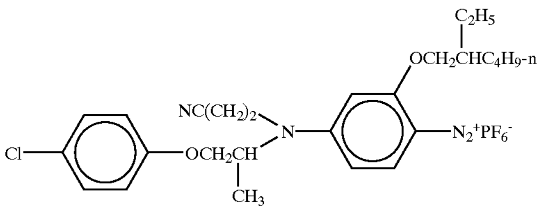
(S)
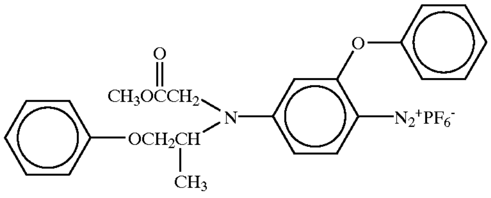
(T)
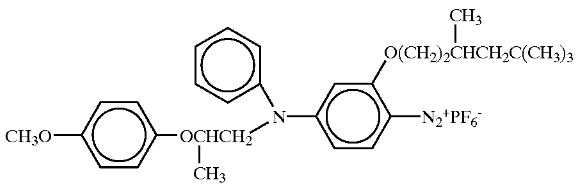
(U)
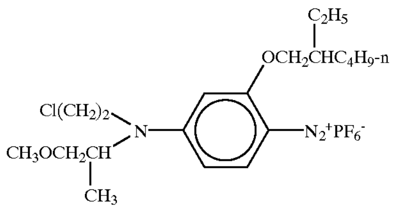

-continued
(I-1)
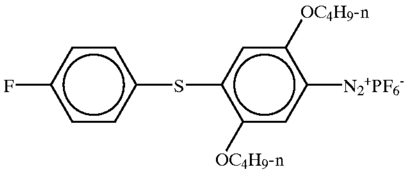
(I-2)
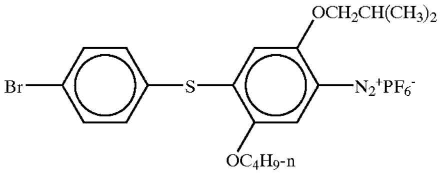
(I-3)
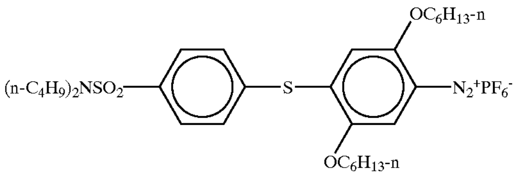
(I-4)
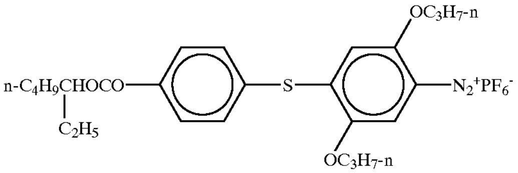
(I-5)
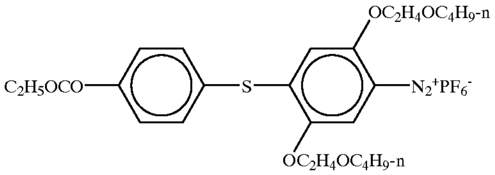
(I-6)
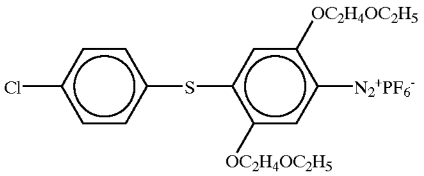
(I-7)
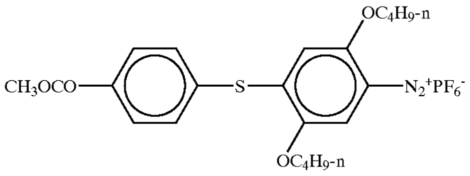
(I-8)
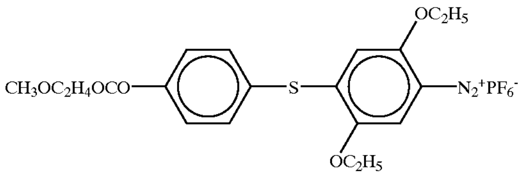
-continued
(I-9)
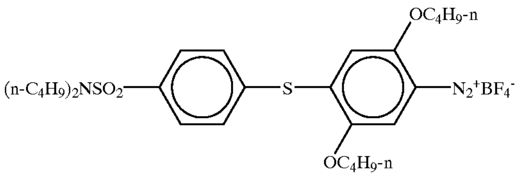
(III-1)
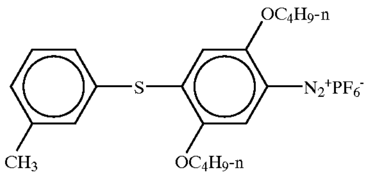
(III-2)
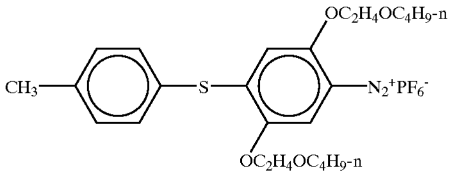
(III-3)
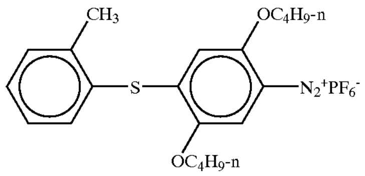
(III-4)
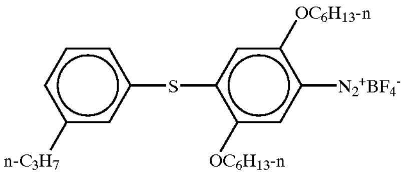
(IV-1)
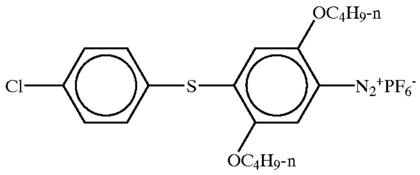
(IV-2)
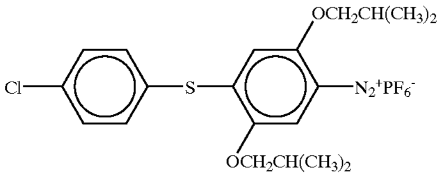
(IV-3)
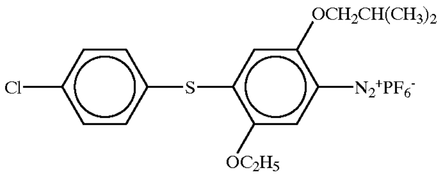

-continued
(IV-4)
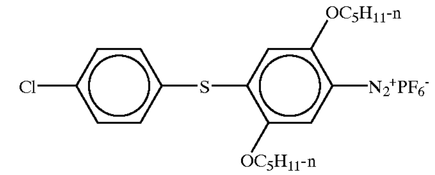
(IV-5)
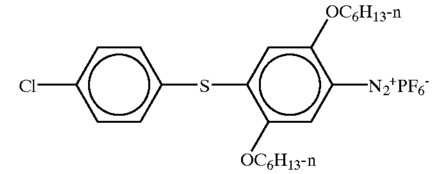
(IV-6)
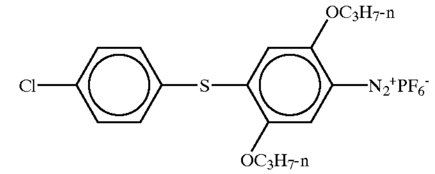
(V-1)
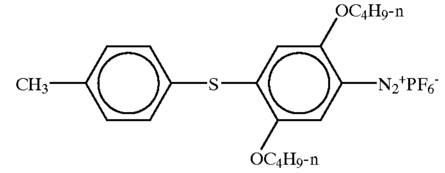
(V-2)
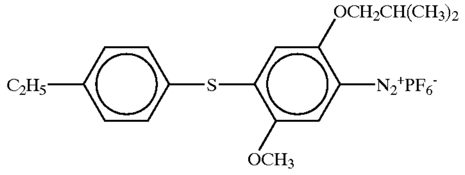
(V-3)
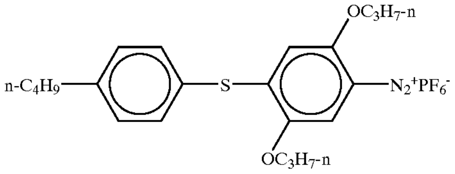
(V-4)
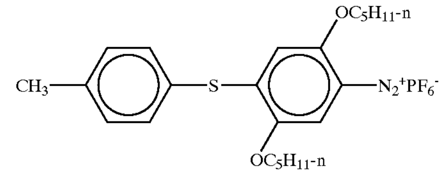
(V-5)
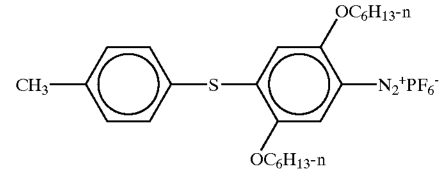
(Specific Examples of the Coupler)
(B-1)
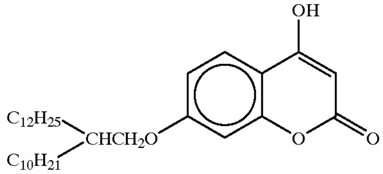
(B-2)
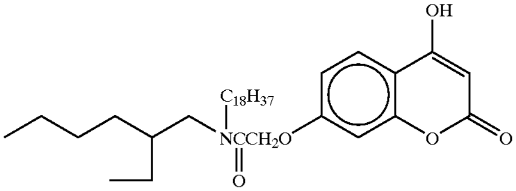
(B-3)
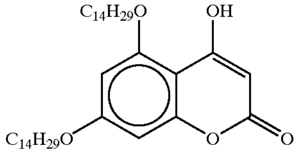
(B-4)
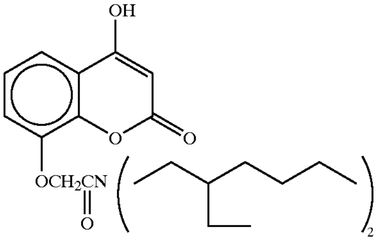
(B-5)
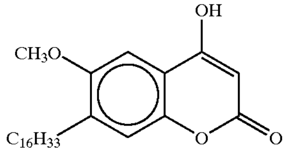
(B-6)
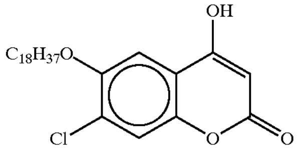
(B-7)
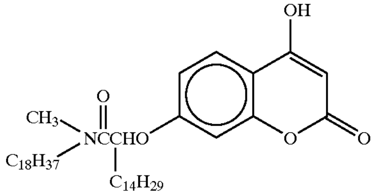
(B-8)
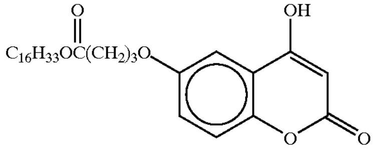

-continued
(B-9)
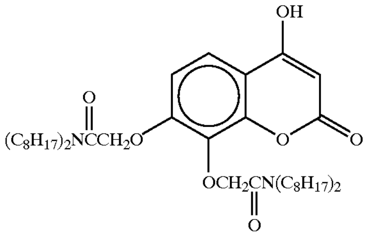
(B-10)
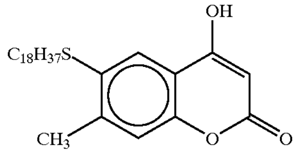
(B-11)
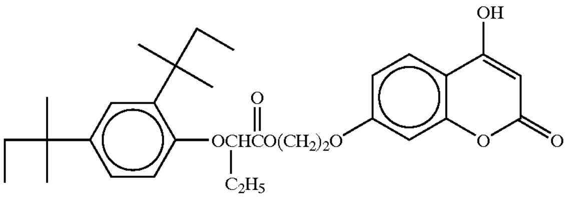
(B-12)
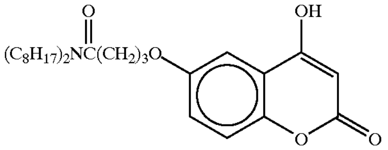
(B-13)
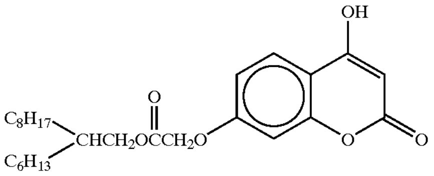
(B-14)
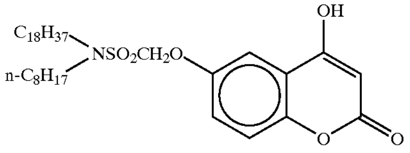
(B-15)
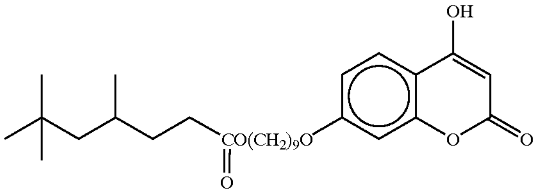
(B-16)
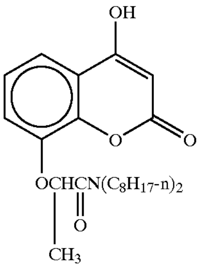
-continued
(B-17)
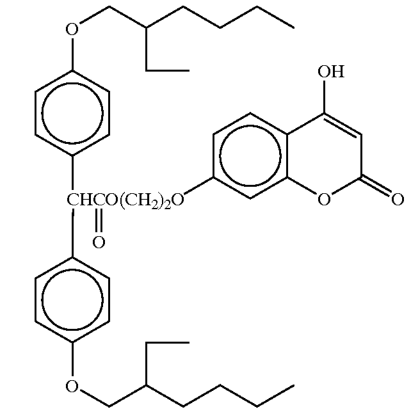
(B-18)
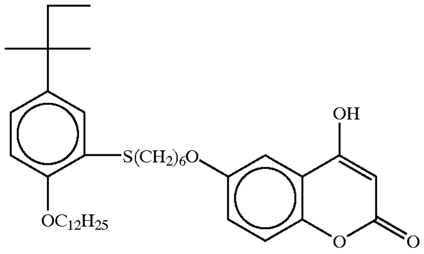
(B-19)
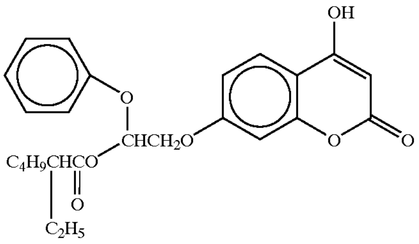
(B-20)
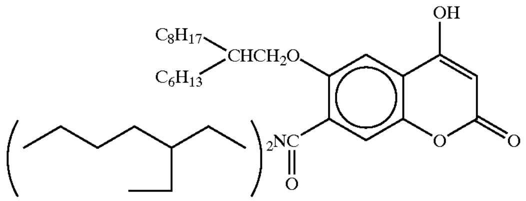
(B-21)
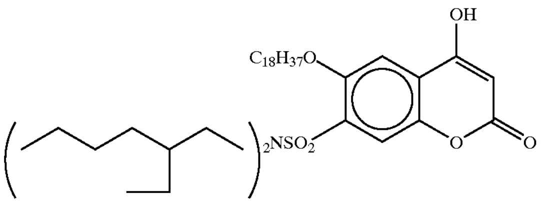
(B-22)
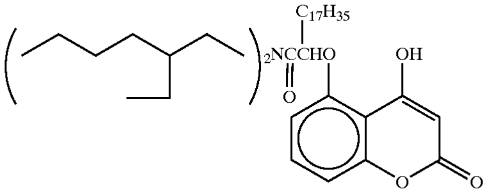

-continued
(B-23)
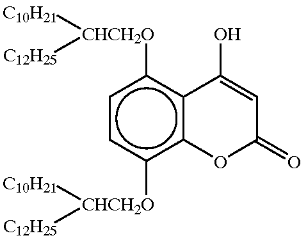
(B-24)
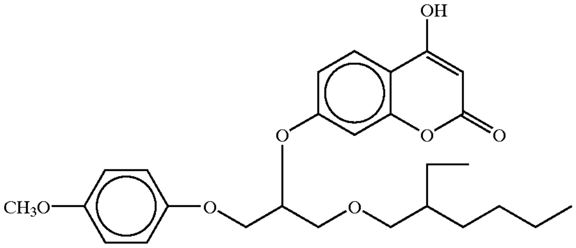
(1)
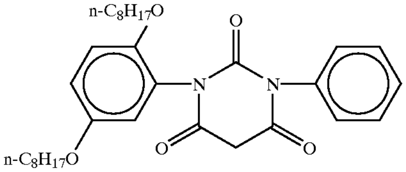
(2)
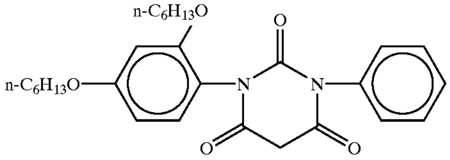
(3)
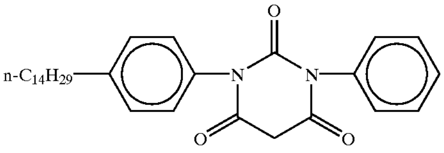
(4)
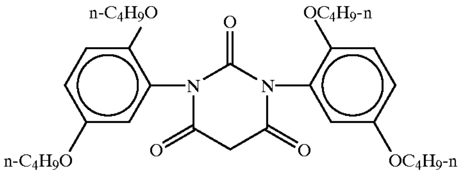
(5)
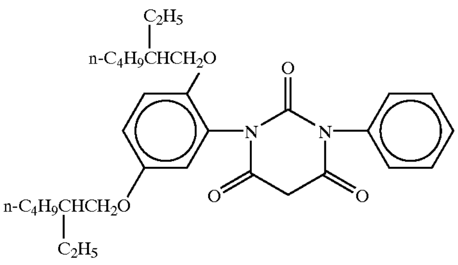
-continued
(6)
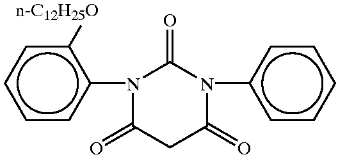
(7)
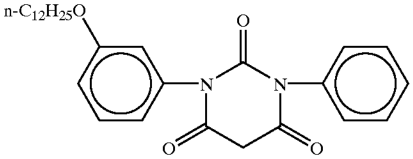
(8)
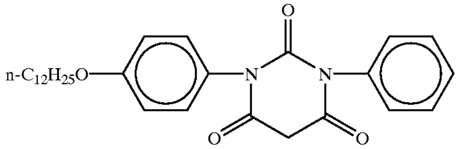
(9)
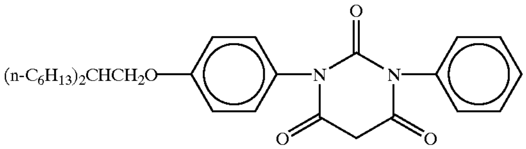
(10)
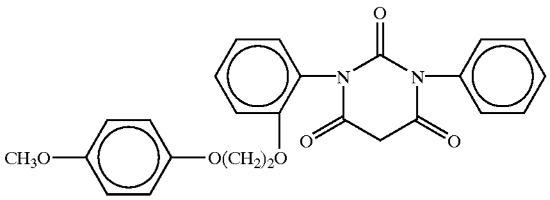
(11)
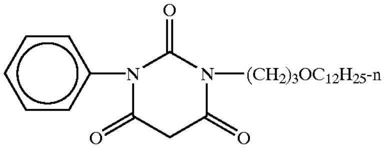
(12)
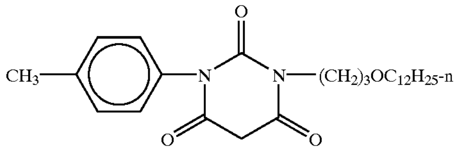
(13)
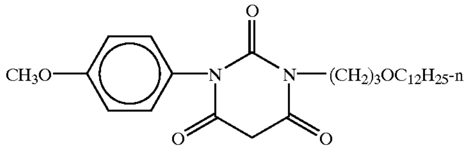
(14)
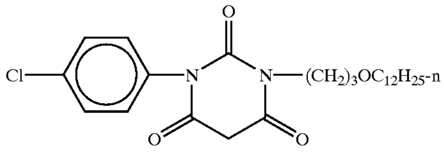

-continued
(15)
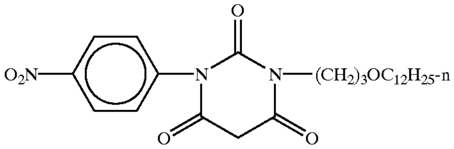
(16)
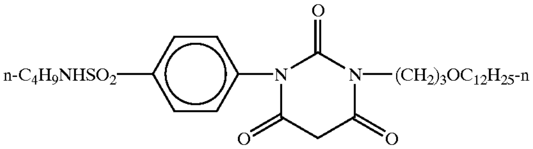
(17)
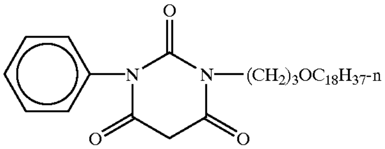
(18)
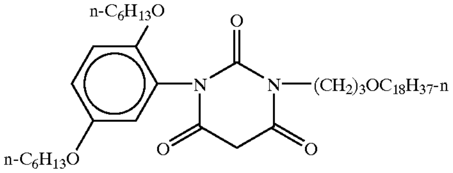
(19)
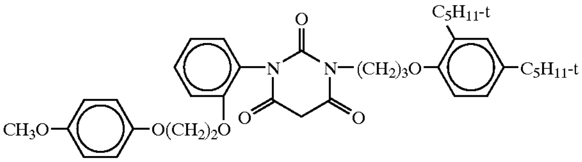
(20)
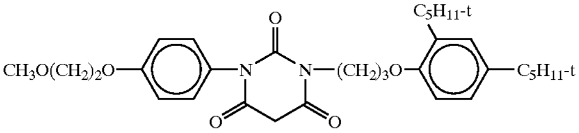
(21)
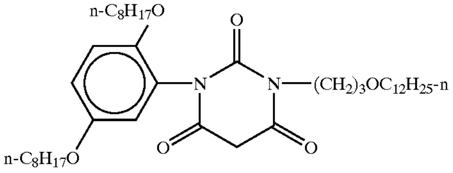
(22)
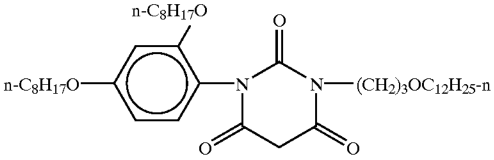
(23)
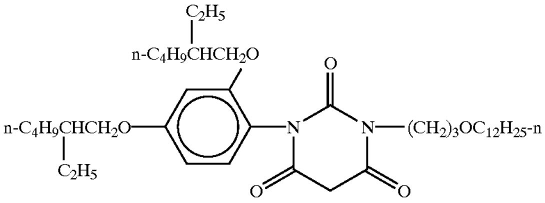
-continued
(24)
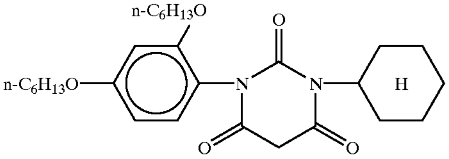
(25)
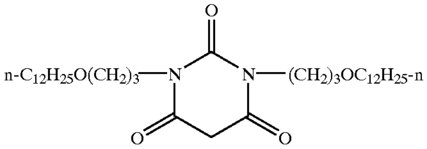
(26)
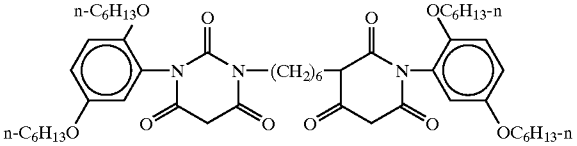
(27)
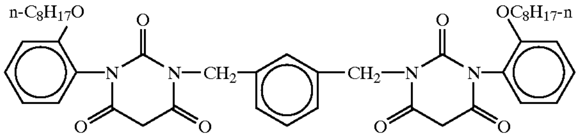
(28)
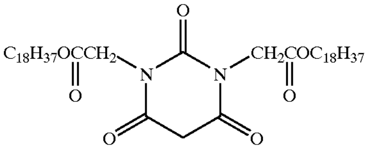
(II-1)
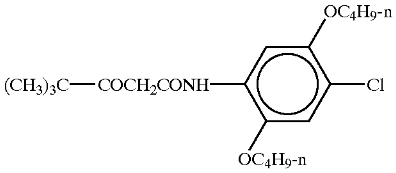
(II-2)
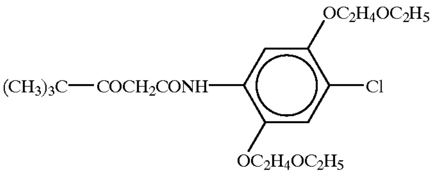
(II-3)
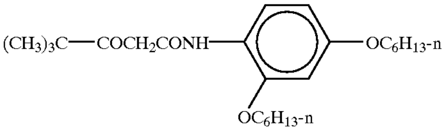
(II-4)
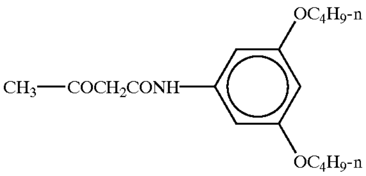

-continued (II-5)

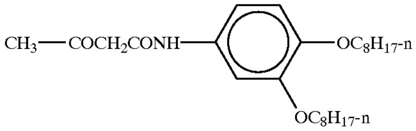

(II-6)

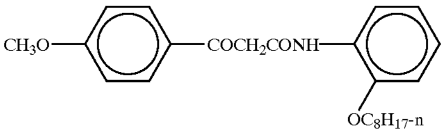

(II-7)

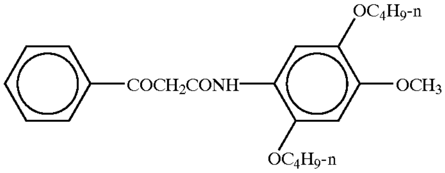

(II-8)

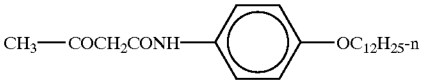

(II-9)

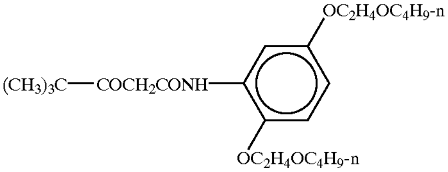

(II-10)

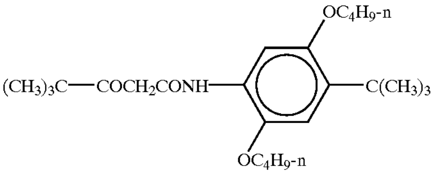

(II-11)

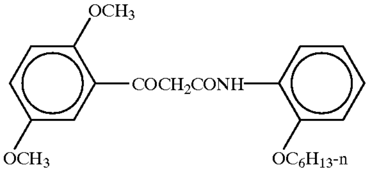

(VI-1)

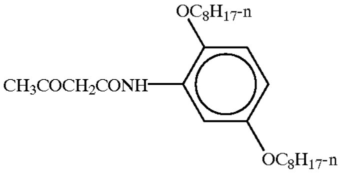

(VI-2)

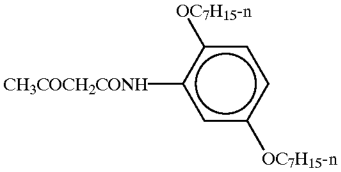

-continued (VI-3)

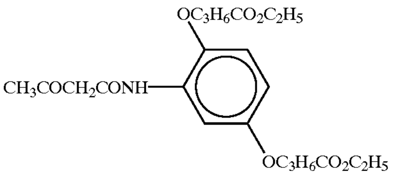

(VI-4)

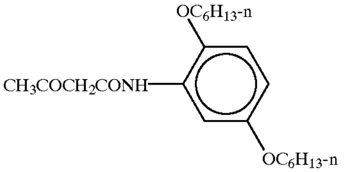

(VI-5)

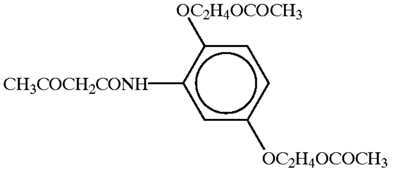

(VI-6)

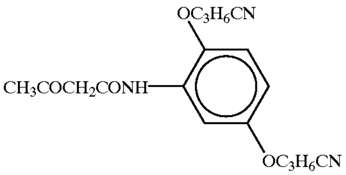

(Specific Examples of the Base)

The base may be used singly or in a combination of two or more. Examples of the base include nitrogen-containing compounds such as tertiary amines, piperizines, piperazines, amidines, formamidines, pyridines, guanidines, and morpholines.

Among these compounds, particularly preferred are piperazines such as N,N'-bis(3-phenoxy-2-hydroxypropyl) piperazine, N,N'-bis(3-(p-methylphenoxy)-2-hydroxypropyl)piperazine, N,N'-bis(3-(p-methoxyphenoxy)-2-hydroxypropyl)piperazine, N,N'-bis(3-phenylthio-2-hydroxypropyl)piperazine, N,N'-bis(3-(β-naphthoxy)-2-hydroxypropyl)piperazine, N-3-(β-naphthoxy)-2-hydroxypropyl-N'-methylpiperazine, and 1,4-bis((3-(N-methylpiperazino)-2-hydroxy)propyloxy) benzene; morpholines such as N-(3-(β-naphthoxy)-2-hydroxy)propylmorpholine, 1,4-bis((3-morpholino-2-hydroxy)propyploxy)benzene, and 1,3-bis((3-morpholino-2-hydroxy)propyploxy)benzene; piperidines such as N-(3-phenoxy-2-hydroxypropyl)piperidine and N-dodecylpiperidine; and guanidines such as triphenylguanidines, tricyclohexylguanidines, and dicyclohexylphenylguanidines.

Details of the electron-donating colorless dye, the electron-accepting compound, and others are described in JP-A Nos.6-328860, 7-290826, 7-314904, 8-324116, 3-37727, 9-31345, 9-111136, 9-118073, 11-157221, etc. Specific examples are given below, though it should be understood that the present invention is not restricted to these examples.

(Specific Examples of the Electron-Donating Colorless Dye)

TABLE 4

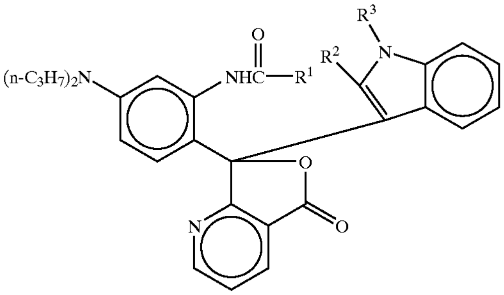

| | $R^1$ | $R^2$ | $R^3$ |
|---|---|---|---|
| i-1 | $—CH_3$ | $—CH_3$ | $—C_2H_5$ |
| i-2 | $—C_2H_5$ | $—CH_3$ | $—C_2H_5$ |
| i-3 | $—CH(CH_3)_2$ | $—CH_3$ | $—C_2H_5$ |
| i-4 | $—C(CH_3)_3$ | $—CH_3$ | $—C_2H_5$ |
| i-5 | 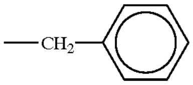 | $—CH_3$ | $—C_2H_5$ |
| i-6 | 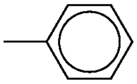 | $—CH_3$ | $—C_2H_5$ |
| i-7 | $—CH_2OCH_3$ | $—CH_3$ | $—C_2H_5$ |
| i-8 | $—CH_2Cl$ | $—CH_3$ | $—C_2H_5$ |
| i-9 | $—CCl_3$ | $—CH_3$ | $—C_2H_5$ |
| i-10 | $—CF_3$ | $—CH_3$ | $—C_2H_5$ |

TABLE 4-continued

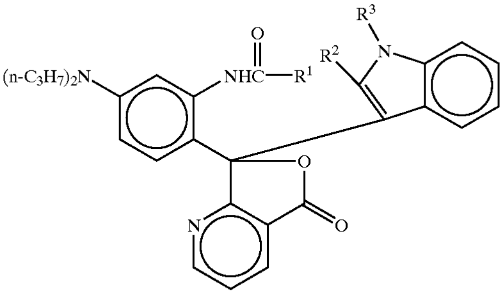

| | $R^1$ | $R^2$ | $R^3$ |
|---|---|---|---|
| i-11 | 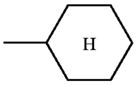 | $—CH_3$ | $—C_2H_5$ |
| i-12 | 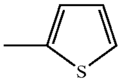 | $—CH_3$ | $—C_2H_5$ |
| i-13 | $—C_3H_7(n)$ | $—CH_3$ | $—C_2H_5$ |
| i-14 | $—CH_3$ | $—CH_3$ | $—C_4H_9(n)$ |
| i-15 | $—CH_3$ | $—CH_3$ | $—C_8H_{17}(n)$ |
| i-16 | $—CH(CH_3)_2$ | $—CH_3$ | $—C_4H_9(n)$ |
| i-17 | 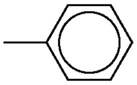 | $—CH_3$ | $—C_5H_{11}(n)$ |
| i-18 | $—CH_2OCH_3$ | $—CH_3$ | $—C_8H_{17}(n)$ |

TABLE 5

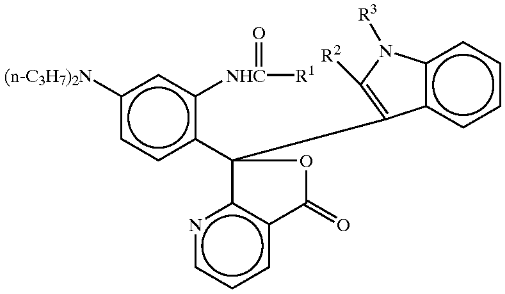

| | $R^1$ | $R^2$ | $R^3$ |
|---|---|---|---|
| i-19 | $—CH_3$ | $—CH_3$ | 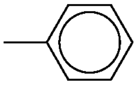 |
| i-20 | 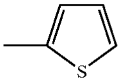 | $—CH_3$ | $—C_6H_{13}(n)$ |
| i-21 | $—CH_3$ | 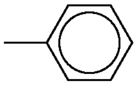 | $—C_2H_5$ |

TABLE 5-continued
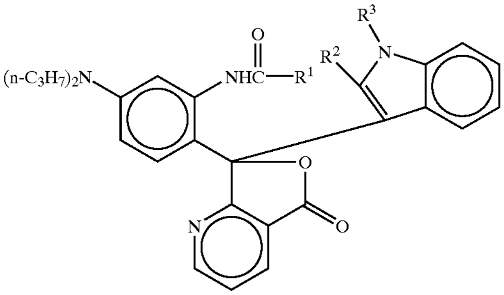
| | R¹ | R² | R³ |
|---|---|---|---|
| i-22 | —$CH_3$ | 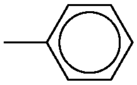 | —$C_8H_{17}$(n) |
| ia-1 | —$C_5H_{11}$(n) | —$CH_3$ | —$C_2H_5$ |
| ia-2 | —$C_7H_{15}$(n) | —$CH_3$ | —$C_2H_5$ |
| ia-3 | —$C_{17}H_{35}$(n) | —$CH_3$ | —$C_2H_5$ |
| ia-4 | 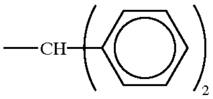 | —$CH_3$ | —$C_2H_5$ |
| ia-5 | 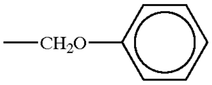 | —$CH_3$ | —$C_2H_5$ |
| ia-6 | 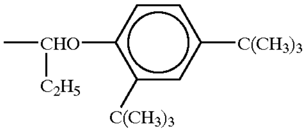 | —$CH_3$ | —$C_2H_5$ |
| ia-7 | —$CH_3$ | —$CH_3$ | —$C_5H_{11}$(n) |
| ia-8 | —$CH_3$ | —$CH_3$ | —$CH(CH_3)_2$ |
| ia-9 | —$C_3H_7$(n) | —$CH_3$ | —$C_8H_{17}$(n) |
| ia-10 | —$C_4H_9$(n) | —$CH_3$ | —$C_8H_{17}$(n) |
TABLE 6
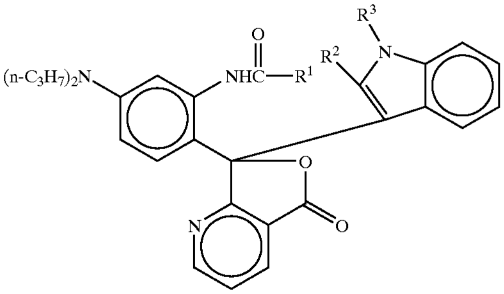
| | R¹ | R² | R³ |
|---|---|---|---|
| ia-11 | —$CH(CH_3)_2$ | —$CH_3$ | —$C_8H_{17}$(n) |
| ia-12 | —$C_3H_7$(t) | —$CH_3$ | —$C_8H_{17}$(n) |
| ia-13 | —$C_4H_9$(t) | —$CH_3$ | —$C_8H_{17}$(n) |
TABLE 6-continued
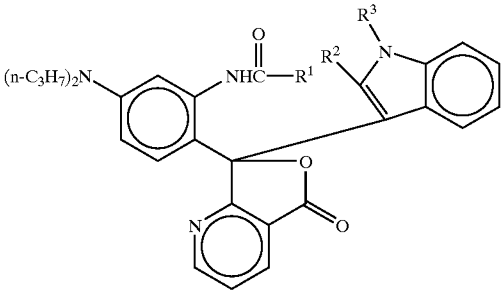
| | R¹ | R² | R³ |
|---|---|---|---|
| ia-14 | 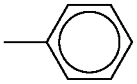 | —$CH_3$ | —$C_8H_{17}$(n) |

TABLE 6-continued

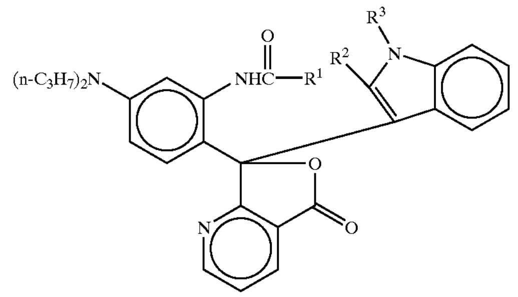

| | $R^1$ | $R^2$ | $R^3$ |
|---|---|---|---|
| ia-15 | 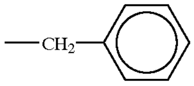 | —$CH_3$ | —$C_8H_{17}$(n) |
| ia-16 | 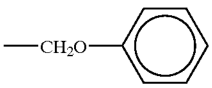 | —$CH_3$ | —$C_8H_{17}$(n) |
| ia-17 | —$C_3H_7$(n) | —$CH_3$ | 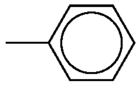 |
| ia-18 | —$CH_3$ | —$CH_3$ | 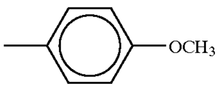 |

i-23

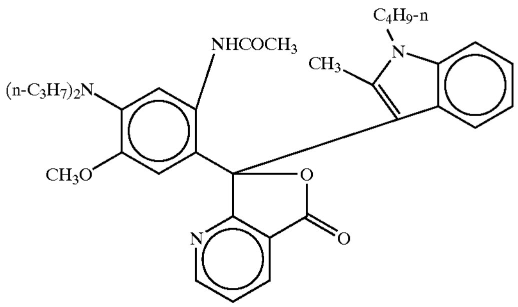

i-24

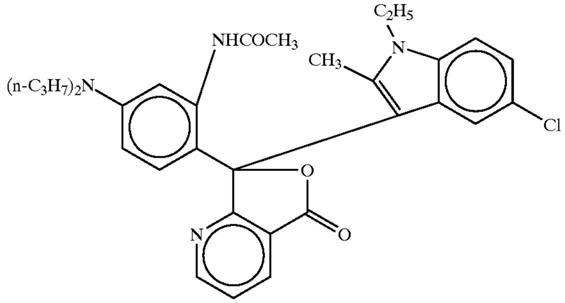

-continued i-25

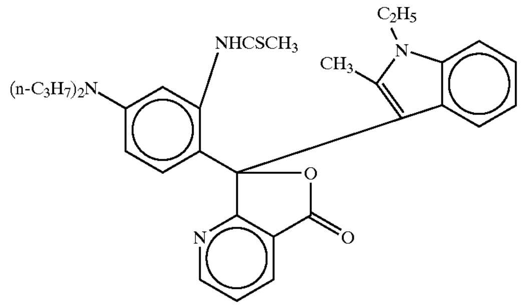

i-26

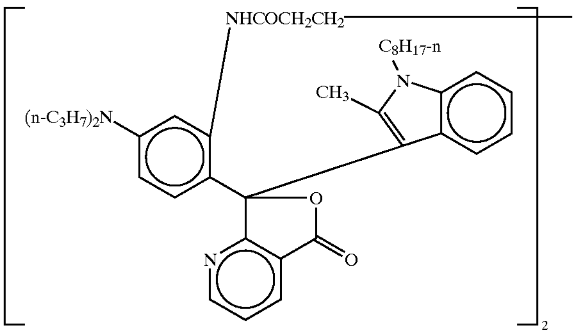

(Specific Examples of the Electron-Accepting Compound)

Examples of the electron-accepting compound include phenol derivatives, salicylic acid derivatives, hydroxybenzoates, etc. In particular, bisphenols and hydroxybenzoates are preferable. Some specific examples thereof include 2,2-bis(p-hydroxyphenyl)propane (i.e., bisphenol A),4,4'-(p-phenylenediisopropylidene)diphenol (i.e., bisphenol P), 2,2-bis(p-hydroxyphenyl)pentane, 2,2-bis(p-hydroxyphenyl)ethane, 2,2-bis(p-hydroxyphenyl) butane, 2,2-bis(4'-hydroxy-3',5'-dichlorophenyl)propane, 1,1-(p-hydroxyphenyl)cyclohexane, 1,1-(p-hydroxyphenyl) propane, 1,1-(p-hydroxyphenyl)pentane, 1,1-(p-hydroxyphenyl)-2-ethylhexane, 3,5-di(α-methylbenzyl) salicylic acid and polyvalent metal salts thereof, 3,5-di(t-butyl)salicylic acid and polyvalent metal salts thereof, 3-α, α-dimethylbenzylsalicylic acid and polyvalent metal salts thereof, butyl p-hydroxybenzoate, benzyl p-hydroxybenzoate, 2-ethylhexyl p-hydroxybenzoate, p-phenylphenol, and p-cumylphenol.

In the present invention, the methods of using the diazonium salt compound, the coupler which reacts with the diazonium salt compound to develop a color when heated, the basic material, the electron-donating colorless dye, the electron-accepting compound, and the sensitizer are not particularly limited. Examples of these methods include (1) a method in which these compounds are used as a dispersion of solid particles; (2) a method in which these compounds are used as an emulsified dispersion; (3) a method in which these compound are used as a polymer dispersion; (4) a method in which these compounds are used as a latex dispersion; and (5) a method in which these compounds are used after being encapsulated in microcapsules. Among these methods, from the viewpoint of storability, a method in which these compounds are used after being encapsulated in microcapsules is more preferable. In particular, it is preferable to enclose the diazonium salt compound in microcapsules in a color-forming system utilizing the reaction between the diazonium salt compound and the coupler; and it is preferable to enclose the electron-donating colorless dye in microcapsules in a color-forming system utilizing the reaction between the electron-donating colorless dye and the electron-accepting compound.

In the present invention, a plurality of the photo-fixing type heat-sensitive recording layers may be laminated. A multicolor heat-sensitive recording material can be obtained by changing the colors of the constituent photo-fixing type heat-sensitive recording layers. Although the layer construction is not particularly limited, preferable is a multicolor heat-sensitive recording material manufactured by laminating two photo-fixing type heat-sensitive recording layers, with the two heat-sensitive recording layers respectively comprising two different diazonium salt compounds sensitive to respectively different wavelengths and couplers which reacts with the diazonium salt compounds to develop a different color when heated, and a photo-fixing type heat-sensitive recording layer which comprises a combination of an electron-donating colorless dye and an electron-accepting compound. That is, the multicolor heat-sensitive recording material comprise a support having disposed thereon a first photo-fixing type heat-sensitive recording layer containing an electron-donating colorless dye and a electron-accepting compound, a second photo-fixing type heat-sensitive recording layer containing a diazonium salt compound whose maximum absorption wavelength is 365±40 nm and a coupler which reacts with the diazonium salt compound to develop a color when heated, and a third photo-fixing type heat-sensitive recording layer containing a diazonium salt compound whose maximum absorption wavelength is 425±40 nm and a coupler which reacts with the diazonium salt compound to develop a color when heated. In the above-described example, full-color image recording is possible if the colors to be developed in the photo-fixing type heat-sensitive recording layers are selected such that these colors constitute the three primary colors, i.e., yellow, magenta, and cyan, respectively, in the subtractive color mixing.

The method of recording in this multicolor heat-sensitive recording material is as follows. First, the third photo-fixing type heat-sensitive recording layer is heated so that a color is formed by the reaction between the diazonium salt compound and the coupler contained in the layer. Next, the third photo-fixing type heat-sensitive recording layer is irradiated with light having a wavelength of 425±40 nm so that the diazonium salt compound remaining unreacted in the third photo-fixing type heat-sensitive recording layer is decomposed. After that, heat in an amount to cause the second photo-fixing type heat-sensitive recording layer to develop a color is applied to the second photo-fixing type heat-sensitive recording layer so that a color is formed by the reaction between the diazonium salt compound and the coupler contained in the second layer. When the heat is applied, although the third photo-fixing type heat-sensitive recording layer is also heated strongly, the third photo-fixing type heat-sensitive recording layer does not develop any color because the diazonium salt compound is already decomposed to an extent that its color-forming capability is lost. Further, the second photo-fixing type heat-sensitive recording layer is irradiated with light having a wavelength of 365±40 nm so that the diazonium salt compound remaining unreacted in the second photo-fixing type heat-sensitive recording layer is decomposed. be Finally, heat in an amount to cause the first photo-fixing type heat-sensitive recording layer to develop a color is applied to the first photo-fixing type heat-sensitive recording layer. When the heat is applied, although the third and second photo-fixing type heat-sensitive recording layers are also heated strongly, these photo-fixing type heat-sensitive recording layers do not develop any color because the diazonium salt compounds are already decomposed to an extent that their color-forming capability is lost.

In the present invention, in order to further improve the lightfastness, conventionally known antioxidants as described in the following publications can be used. For example, EP 310551A, German Patent Application Laid-Open (OLS) No. 3435443, EP 310552A, JP-A No.3-121449, EP 459416A, JP-A Nos.2-262654, 2-71262, and 63-163351, U.S. Pat. No. 4,814,262, JP-A Nos.54-48535, 5-61166, and 5-119449, U.S. Pat. No. 4,980,275, JP-A Nos.63-113536 and 62-262047, EP 223739A, EP 309402A, EP 309401A, etc.

It is also effective to use additives which are conventionally known in heat-sensitive recording materials and pressure-sensitive recording materials. Some examples of these antioxidants include the compounds described in JP-A Nos.60-125470, 60-125471, 60-125472, 60-287485, 60-287486, 60-287487, 62-146680, 60-287488, 62-282885, 63-89877, 63-88380, 63-088381, 01-239282, 04-291685, 04-291684, 05-188687, 05-188686, 05-110490, 05-1108437, 05-170361, 63-203372, 63-224989, 63-267594, 63-182484, 60-107384, 60-107383, 61-160287, 61-185483, 61-211079, 63-251282, and 63-051174, JP-B Nos. 48-043294 and 48-033212, etc.

A conventionally known binder can be used as the binder in the present invention. Examples of the binder include water-soluble polymers such as polyvinyl alcohol and gelatin, and polymer latices, etc.

A plastic film, paper, plastic resin-laminated paper, synthetic paper, or the like can be used as the support in the present invention.

In the present invention, in the case where heat-sensitive color-forming layers for different colors are laminated, an interlayer can be provided in order to prevent color mixing, etc. In the interlayer, a water-soluble polymeric compound is used. Examples of the water-soluble polymeric compound include polyvinyl alcohol, modified polyvinyl alcohol, methyl cellulose, sodium polystyrenesulfonate, styrene/maleic acid copolymers, and gelatin.

The light transmittance controlling layer and the protective layer in the present invention may contain various pigments, a release agent, and the like besides the water-soluble polymeric compound similar to that for the interlayer.

EXAMPLES

The present invention is described using the following examples. However the invention is not limited by these examples. All "parts" and "percentages" are by weight unless otherwise specified.

Example 1

<Preparation of a Phthalated Gelatin Solution>

A mixture composed of 32 parts of phthalated gelatin (trade name: MGP Gelatin, manufactured by Nitsubi Kolegen Co., Ltd.), 0.9143 parts of 1,2-benzothiazoline-3-one (a 3.5% methanol solution, manufactured by Daitoh Kagaku Kogyosho Co., Ltd.), and 367.1 parts of ion-exchanged water was made into a solution at 40° C. to thereby prepare an aqueous solution of phthalated gelatin.

<Preparation of a Gelatin Solution for Making an Emulsion>

A mixture composed of 25.5 parts of alkali-treated low-ion gelatin (trade name: No.750 Gelatin, manufactured by Nitta Gelatin, Co., Ltd.), 0.7286 parts of 1,2-benzothiazoline-3-one (a 3.5% methanol solution, manufactured by Daitoh Kagaku Kogyosho Co., Ltd.), 0.153 parts of calcium hydroxide, and 143.6 parts of ion-exchanged water was made into a solution at 50° C. to thereby prepare an aqueous solution of gelatin for making an emulsion.

(1) Preparation of a Coating Solution (a) for Yellow Heat-Sensitive Recording Layer <Preparation of a Solution (a) having Microcapsules Enclosing Diazonium Salt Compounds>

To 16.1 parts of ethyl acetate were added 2.2 parts of the following diazonium salt compound (A) (maximum absorption wavelength: 420 nm), 2.2 parts of the following diazonium salt compound (B) (maximum absorption wavelength: 420 nm), 4.8 parts of monoisopropylbiphenyl, 4.8 parts of diphenyl phthalate, and 0.4 parts of diphenyl-(2,4,6-trimethylbenzoyl)phosphine oxide (trade name: LUCILIN TPO, manufactured by BASF Japan Co., Ltd.) The mixture was heated to 40° C. and made into a homogeneous solution. To the solution thus obtained was added 8.6 parts of a mixture composed of a xylylene diisocyanate/trimethylol propane adduct and a xylylene diisocyanate/bisphenol A adduct (trade name: TAKENATE D-119N (a 50% ethyl acetate solution), manufactured by Takeda Chemical Industries, Ltd.) as a capsule wall forming material, and the resulting mixture was uniformly stirred. In this way, a blend solution (I) was obtained.

A blend solution (II) was obtained by adding 16.3 parts of ion-exchanged water and 0.34 parts of Scraph AG-8 (50%) (manufactured by Nippon Seika Co., Ltd.) to 58.6 parts of the phthalated gelatin solution described above.

The blend solution (I) was added to the blend solution (II) and the resulting mixture was subjected to emulsifying dispersion by using a homogenizer (manufactured by Nippon Seiki Seisakusho Co., Ltd.) at 40° C. Then, 20 parts of water was added to the emulsified solution and the solution was homogenized. Next, an encapsulation reaction was carried out by stirring the solution at 40° C. for 3 hours while removing the ethyl acetate. After that, 4.1 parts of AMBERLITE IRA68 (manufactured by Orugano Co., Ltd.) and 8.2 parts of AMBERLITE IRC50 (manufactured by Orugano Co., Ltd.) were added as ion-exchange resins and the solution was stirred for another hour. The ion-exchange resins were then eliminated by filtration and the concentration of the capsule solution was adjusted so that the concentration of the solid components became 20.0%. In this way, a solution (a) containing microcapsules enclosing diazonium salt compounds was obtained. The median particle diameter of the microcapsules obtained was found to be 0.36 $\mu$m as a result of measurement (by means of LA-700, manufactured by Horiba Seisakusho Co., Ltd.).

Diazonium salt compound (A)

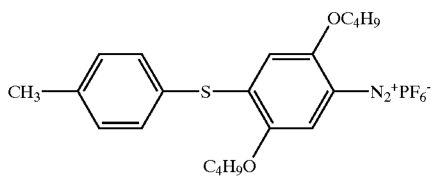

-continued

Diazonium salt compound (B)

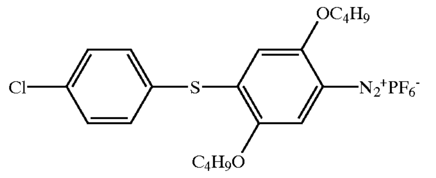

<Preparation of an Emulsion Solution (a) of a Coupler Compound>

A blend solution (III) was prepared by dissolving 9.9 parts of the following coupler compound (C), 9.9 parts of triphenylguanidine (manufactured by Hodogaya Chemical Company Ltd.), 10.4 parts of 4,4'-(m-phenylenediisopropylidene)diphenol (trade name: Bisphenol M, manufactured by Mitsui Petrochemical Co., Ltd.), 3.3 parts of 3,3,3',3'-tetramethyl-5,5',6,6'-tetra(1-propyloxy)-1,1'-spirobisindan, 13.6 parts of 4-(2-ethylhexyloxy)benzenesulfonic acid amide (manufactured by Manac Inc.), 6.8 parts of 4-n-pentyloxybenzenesulfonic acid amide (manufactured by Manac Inc.), and 4.2 parts of calcium dodecylbenzenesulfonate (trade name: PIONIN A-41-C, a 70% methanol solution, manufacture by Takemoto Oil & Fat Co., Ltd.) in 33.0 parts of ethyl acetate.

A blend solution (IV) was prepared by blending 206.3 parts of the aqueous solution of alkali-treated gelatin described above with 107.3 parts of ion-exchanged water.

The blend solution (III) was added to the blend solution (IV) and the resulting mixture was subjected to emulsifying dispersion by using a homogenizer (manufactured by Nippon Seiki Seisakusho Co., Ltd.) at 40° C. The emulsion of the coupler compound thus obtained was heated under a reduced pressure to remove the ethyl acetate. After that, the concentration of the emulsion was adjusted so that the concentration of the solid components became 26.5%. The median particle diameter of the particles in the emulsion of the coupler compound obtained was found to be 0.21 $\mu$m as a result of measurement (by means of LA-700, manufactured by Horiba Seisakusho Co., Ltd.).

Further, 9 parts of an SBR latex (trade name: SN-307, content of solid components: 48%, manufactured by Sumika ABS Latex Co., Ltd.) whose concentration had been adjusted to 26.5% was added to 100 parts of the emulsion of the coupler compound and the resulting mixture was homogenized by stirring. In this way, an emulsion solution (a) of a coupler compound was obtained.

Coupler Compound C

Coupler compound C

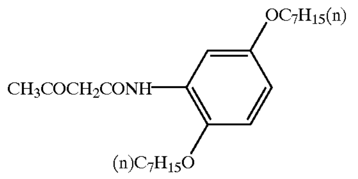

<Preparation of a Coating Solution (a)>

The solution (a) containing microcapsules enclosing the diazonium salt compounds and the emulsion solution (a) of the coupler compound were mixed together such that weight ratio of the enclosed coupler compound/diazo compounds became 2.2/1. In this way, a coating solution (a) for yellow heat-sensitive recording layer was obtained.

(2) Preparation of a Coating Solution (b) for Magenta Heat-Sensitive Recording Layer <Preparation of a Solution (b) Containing Microcapsules Enclosing a Diazonium Salt Compound>

To 15.1 parts of ethyl acetate were added 2.8 parts of the following diazonium salt compound (D) (maximum absorption wavelength: 365 nm), 1.9 parts of diphenyl phthalate, 3.9 parts of phenyl 2-benzoyloxybenzoate, 4.2 parts of the following compound (E) (LIGHT ESTER TMP, manufactured by Kyoei Yushi Kagaku Co., Ltd.), and 0.1 parts of calcium dodecylbenzenesulfonate (trade name: PIONIN A-41-C, a 70% methanol solution, manufacture by Takemoto Oil & Fat Co., Ltd.) and the resulting mixture was made into a homogeneous solution by heating. To the solution thus obtained were added 2.5 parts of a mixture composed of a xylylene diisocyanate/trimethylol propane adduct and a xylylene diisocyanate/bisphenol A adduct (trade name: TAKENATE D-119N (a 50% ethyl acetate solution), manufactured by Takeda Chemical Industries, Ltd.) and 6.8 parts of a xylylene diisocyanate/trimethylolpropane adduct (trade name: TAKENATE D-110N (a 75% ethyl acetate solution), manufactured by Takeda Chemical Industries, Ltd.) as capsule wall forming materials, and the resulting mixture was uniformly stirred. In this way, a blend solution (V) was obtained.

A blend solution (VI) was obtained by adding 21.0 parts of ion-exchanged water to 55.3 parts of the phthalated gelatin solution.

The blend solution (V) was added to the blend solution (VI) and the resulting mixture was subjected to emulsifying dispersion by using a homogenizer (manufactured by Nippon Seiki Seisakusho Co., Ltd.) at 40° C. Then, 24 parts of water was added to the emulsified solution and the solution was homogenized. Next, an encapsulation reaction was carried out by stirring the solution at 40° C. for 3 hours while removing the ethyl acetate. After that, 4.1 parts of AMBERLITE IRA68 (manufactured by Orugano Co., Ltd.) and 8.2 parts of AMBERLITE IRC50 (manufactured by Orugano Co., Ltd.) as ion-exchange resins were added and the solution was stirred for another hour. The ion-exchange resins were then eliminated by filtration and the concentration of the capsule solution was adjusted so that the concentration of the solid components became 20.0%. In this way, a solution (b) containing microcapsules enclosing a diazonium salt compound was obtained. The median particle diameter of the microcapsules obtained was found to be 0.43 μm as a result of measurement (by means of LA-700, manufactured by Horiba Seisakusho Co., Ltd.). Diazonium salt compound (D)

Diazonium salt compound (D)

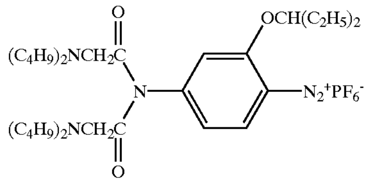

Compound (E)

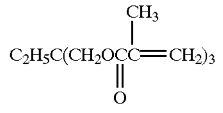

<Preparation of an Emulsion Solution (b) of a Coupler Compound>

A blend solution (VII) was prepared by dissolving 11.9 parts of the following coupler compound (F), 14.0 parts of triphenylguanidine (manufactured by Hodogaya Chemical Company Ltd.), 14.0 parts of 4,4'-(m-phenylenediisopropylidene)diphenol (trade name: Bisphenol M, manufactured by Mitsui Petrochemical Co., Ltd.), 14.0 parts of 1,1-(p-hydroxyphenyl)-2-ethylhexane, 3.5 parts of 3,3,3',3'-tetramethyl-5,5',6,6'-tetra(1-propyloxy)-1,1'-spirobisindan, 3.5 parts of the following compound (G), 1.7 parts of tricresyl phosphate, 0.8 parts of diethyl maleate, and 4.5 parts of calcium dodecylbenzenesulfonate (trade name: PIONIN A-41-C, a 70% methanol solution, manufacture by Takemoto Oil & Fat Co., Ltd.) in 36.9 parts of ethyl acetate.

A blend solution (VIII) was prepared by blending 206.3 parts of the aqueous solution of alkali-treated gelatin with 107.3 parts of ion-exchanged water.

The blend solution (VII) was added to the blend solution (VIII) and the mixture was subjected to emulsifying dispersion by using a homogenizer (manufactured by Nippon Seiki Seisakusho Co., Ltd.) at 40° C. The emulsion of the coupler compound thus obtained was heated under a reduced pressure to remove the ethyl acetate. After that, the concentration of the emulsion was adjusted so that the concentration of the solid components became 24.5%. In this way, an emulsion solution (b) of a coupler compound was obtained. The median particle diameter of the particles in the emulsion solution of the coupler compound obtained was found to be 0.22 μm as a result of measurement (by means of LA-700, manufactured by Horiba Seisakusho Co., Ltd.).

Coupler compound F

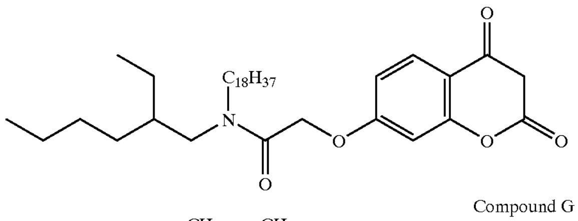

Compound G

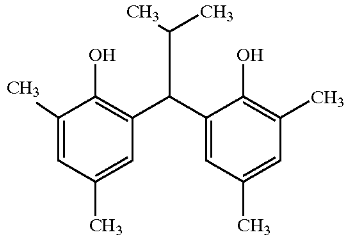

<Preparation of a Coating Solution (b)>

The solution (b) containing microcapsules enclosing a diazonium salt compound and the emulsion solution (b) of a coupler compound were mixed together such that weight ratio of the enclosed coupler compound/diazo compound became 3.5/1. Further, an aqueous (5%) solution of polystyrenesulfonic acid (partially neutralized by potassium hydroxide) in a proportion of 0.2 parts per 10 parts of the solution containing microcapsules was mixed into the solution containing microcapsules. In this way, a coating solution (b) for magenta heat-sensitive recording layer was obtained.

(3) Preparation of a Coating Solution (c) for Cyan Heat-Sensitive Recording Layer <Preparation of a Solution (c) Containing Microcapsules Enclosing an Electron-Donating Dye Precursor>

To 18.1 parts of ethyl acetate were added 7.6 parts of the following electron-donating dye (H), 8.0 parts of a solution composed of the mixture of 1-methylpropylphenylphenylmethane and 1-(1-methylpropylphenyl)-2-phenylethane (trade name: HISOL SAS-310, manufactured by Nippon Petroleum Co., Ltd.), and 8.0 parts of the following compound (I) (trade name: Irgaperm 2140, manufactured by Ciba-Geigy Corp.). The mixture was heated and made into a homogeneous solution.

To the solution thus obtained was added 7.2 parts of a xylylene diisocyanate/trimethylol propane adduct (trade name: TAKENATE D-110N (a 75% ethyl acetate solution), manufactured by Takeda Chemical Industries, Ltd.) and 10.6 parts of polymethylenepolyphenyl polyisocyanate (trade name: MILLIONATE MR-200, manufactured Nippon Polyurethane Industry Co., Ltd.) as capsule wall forming materials, and the mixture was uniformly stirred. In this way, a blend solution (IX) was obtained.

A blend solution (X) was obtained by adding 9.5 parts of ion-exchanged water, 0.17 parts of Scraph AG-8 (50%) (manufactured by Nippon Seika Co., Ltd.), and 4.3 parts of sodium dodecylbenzenesulfonate (10% aqueous solution) to 28.8 parts of the phthalated gelatin solution described above.

The blend solution (IX) was added to the blend solution (X) and the resulting mixture was subjected to emulsifying dispersion by using a homogenizer (manufactured by Nippon Seiki Seisakusho Co., Ltd.) at 40° C. Then, 50 parts of water and 0.12 parts of tetraethylenepentamine were added to the emulsified solution thus obtained and the solution was homogenized. Next, an encapsulation reaction was carried out by stirring the solution at 65° C. for 3 hours while removing the ethyl acetate. After that, the concentration of the capsule solution was adjusted so that the concentration of the solid components became 33%. In this way, a solution containing microcapsules was obtained. The median particle diameter of the microcapsules obtained was found to be 1.00 μm as a result of measurement (by means of LA-700, manufactured by Horiba Seisakusho Co., Ltd.).

Further, a 25% aqueous solution of sodium dodecylbenzenesulfonate (trade name: NEOPELEX F-25, manufactured by Kao Corporation) in a proportion of 3.7 parts and a 4,4'-bistriazinylaminostilbene-2,2'-disulfone derivative (trade name: Kaycall BXNL, manufactured by Nippon Soda Co., Ltd.) in a proportion of 4.3 parts were added to 100 parts of the solution of microcapsules and the resulting mixture was uniformly stirred. As a result, a solution (c) containing dispersed microcapsules was obtained.

Electron-donating dye H

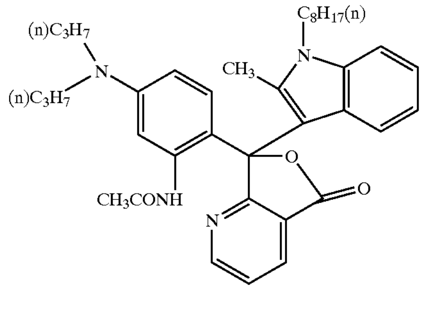

-continued

Compound I

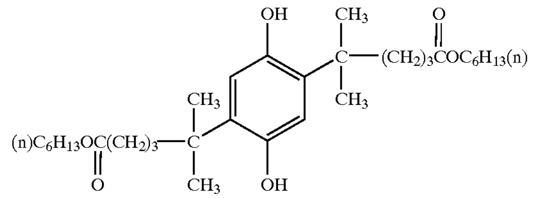

<Preparation of a Dispersion Solution (c) of an Electron-Accepting Compound>

To 11.3 parts of the above-described aqueous solution of phthalated gelatin were added 30.1 parts of ion-exchanged water, 15 parts of 4,4'-(p-phenylenediisopropylidene) diphenol (trade name: Bisphenol P, manufactured by Mitsui Petrochemical Co., Ltd.), and 3.8 parts of a 2% aqueous solution of sodium 2-ethylhexyl succinate and the resulting mixture was dispersed overnight in a ball mill. The dispersion solution thus obtained had a concentration of solid components of 26.6%.

To 100 parts of the dispersion solution was added 45.2 parts of the aqueous solution of alkali-treated gelatin described above and the resulting mixture was stirred for 30 minutes. After that, the concentration of solid components of the dispersion solution was adjusted to 23.5% by the addition of ion-exchanged water. In this way, a dispersion solution (c) containing an electron-accepting compound was obtained.

<Preparation of a Coating Solution (c)>

The solution (c) containing microcapsules enclosing an electron-donating dye precursor and the dispersion solution (c) of an electron-accepting compound were mixed together such that weight ratio of the electron-accepting compound/the electron-donating dye precursor became 10/1. In this way, a coating solution (c) for cyan heat-sensitive recording layer was obtained.

(4) Preparation of Coating Solution for Forming Interlayer 100.0 parts of alkali-treated low-ion gelatin (trade name: No.750 Gelatin, manufactured by Nitta Gelatin, Co., Ltd.), 2.857 parts of 1,2-benzothiazoline-3-one (a 3.5% methanol solution, manufactured by Daitoh Kagaku Kogyosho Co., Ltd.), 0.5 parts of calcium hydroxide, and 521.643 parts of ion-exchanged water were mixed together and made into a solution at 50° C. to thereby obtain an aqueous solution of gelatin for forming interlayer. 10.0 parts of the aqueous solution of gelatin for forming interlayer, 0.05 parts of sodium (4-nonylphenoxytrioxyethylene)butylsulfonate (a 2.0% aqueous solution, manufactured by Sankyo Kagaku Co., Ltd.), 1.5 parts of boric acid (a 4.0% aqueous solution), 0.19 parts of an aqueous (5%) solution of polystyrenesulfonic acid (partially neutralized by potassium hydroxide), 4.53 parts of a 4% aqueous solution of the following compound (J) (manufactured by Wako Pure Chemical Industries, Ltd.), and 0.67 parts of ion-exchanged water were mixed together. The mixture was used as the coating solution for forming interlayer.

Compound J

3:1 mixture of $$(CH_2{=}CHSO_2CH_2CONHCH_2)_2—$$

and $$CH_2(CH_2NHCOCH_2SO_2CH{=}CH_2)_2$$

(5) Preparation of a Solution for Forming Light Transmittance Controlling Layer

<Preparation of a Solution Containing Microcapsules Enclosing an Ultraviolet Light Absorber Precursor>

14.5 parts of [2-allyl-6-(2H-benzotriazole-2-yl)-4-t-octylphenyl]benzenesulfonate as an ultraviolet light absorber precursor, 5.0 parts of the following hydrogen-donor (A-1), 1.9 parts of tricresyl phosphate, 5.7 parts of α-methylstyrene dimer (tradename: MSD-100, manufactured by Mitsui Chemical Co., Ltd.), and 1.26 parts of sodium dodecylbenzenesulfonate (trade name: NEOPELEX F-25, manufactured by Kao Corporation) were homogeneously dissolved in 71 parts of ethyl acetate. To the resulting blend solution was added 54.7 parts of a xylylene diisocyanate/trimethylolpropane adduct (trade name: TAKENATE D-110N (a 75% ethyl acetate solution), manufactured by Takeda Chemical Industries, Ltd.) as a capsule wall forming material and the resulting mixture was homogeneously stirred. In this way, a blend solution (VII) of an ultraviolet light absorber precursor was obtained.

A-1

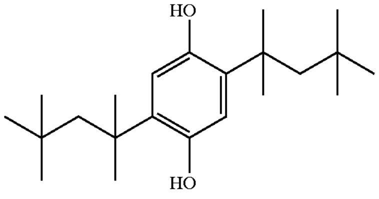

On the other hand, an aqueous solution of PVA for the solution containing microcapsules enclosing an ultraviolet light absorber precursor was prepared by blending 52 parts of itaconic acid-modified polyvinyl alcohol (trade name: KL-318, manufactured by Kuraray Co., Ltd.) with 532.6 parts of ion-exchanged water.

The blend solution (VII) of an ultraviolet light absorber precursor was added to 516.06 parts of the aqueous solution of PVA for the solution containing microcapsules enclosing an ultraviolet light absorber precursor and the resulting mixture was subjected to emulsifying dispersion by using a homogenizer (manufactured by Nippon Seiki Seisakusho Co., Ltd.) at 20° C. Then, 254.1 parts of ion-exchanged water was added to the emulsified solution and the solution was homogenized. Next, an encapsulation reaction was carried out by stirring the solution at 40° C. for 3 hours. After that, 94.3 parts of AMBERLITE MB-3 (manufactured by Orugano Co., Ltd.) as an ion-exchange resin was added and the solution was stirred for another hour. The ion-exchange resin was then eliminated by filtration and the concentration of the capsule solution was adjusted so that the concentration of the solid components became 13.5%. In this way, a solution containing microcapsules enclosing an ultraviolet light absorber precursor was obtained. The median particle diameter of the microcapsules obtained was found to be 0.23±0.05 μm as a result of measurement (by means of LA-700, manufactured by Horiba Seisakusho Co., Ltd.).

<Preparation of a Coating Solution for Forming Light Transmittance Controlling Layer>

A coating solution for forming light transmittance controlling layer was obtained by mixing 1000 parts of the solution containing microcapsules enclosing an ultraviolet light absorber precursor, 5.2 parts of the following compound K (trade name: Megafac F-120, a 5% aqueous solution, manufactured by Dainippon Ink & Chemicals, Inc.), 7.75 parts of a 4% aqueous solution of sodium hydroxide, and 73.39 parts of sodium (4-nonylphenoxytrioxyethylene)butylsulfonate (a 2.0% aqueous solution, manufactured by Sankyo Kagaku Co., Ltd.).

Compound K

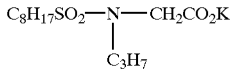

(6) Preparation of a Coating Solution for Protective Layer

<Preparation of a Polyvinyl Alcohol Solution for Forming Protective Layer>

A homogeneous polyvinyl alcohol solution for forming protective layer was obtained by mixing 160 parts of a vinyl alcohol/alkyl vinyl ether copolymer (trade name: EP-130, manufactured by Denki Kagaku Kogyo Kabushiki Kaisha), 8.74 parts of a blend solution of a sodium alkylsulfonate and a polyoxyethylene alkyl ether phosphoric ester (trade name: NEOSCORE CM-57, a 54% aqueous solution, manufactured by Toho Chemical Industry Co., Ltd.), and 3832 parts of ion-exchanged water and making the mixture into a homogeneous solution at 90° C. by allowing it to dissolve for one hour.

<Preparation of a Dispersion Solution of a Pigment for Protective Layer>

A mixture comprising 8 parts of barium sulfate (trade name: BF-21F, having a barium sulfate content of 93% or more, manufactured by Sakai Chemical Industry, Ltd.), 0.2 parts of an anionic special polycarboxylic acid type polymeric surfactant (trade name: POISE 532A (a 40% aqueous solution), manufactured by Kao Corporation), and 11.8 parts of ion-exchanged water was dispersed in a Dyno mill to thereby prepare a dispersion solution of barium sulfate. The median particle diameter of the dispersed particles was found to be 0.15 μm or less as a result of measurement (by means of LA-910, manufactured by Horiba Seisakusho Co., Ltd.).

A dispersion solution of a pigment for protective layer was obtained by adding 8.1 parts of colloidal silica (trade name: SNOWTEX O(a 20% aqueous dispersion), manufactured by Nissan Chemical Co., Ltd.) to 45.6 parts of the dispersion solution of barium sulfate.

<Preparation of a Dispersion Solution of a Matting Agent for Protective Layer>

A dispersion solution of a matting agent for protective layer was prepared by blending 220 parts of wheat starch (trade name: KOMUGI DENPUN S, manufactured by Shinshin Shokuryo Kogyo Co., Ltd.) with 3.81 parts of an aqueous dispersion of 1-2-benzisothiazoline-3-one (trade name: PROXEL B.D, manufactured by I.C.I Limited) and 1976.19 parts of ion-exchanged water and uniformly dispersing these components.

<Preparation of a Blend Solution for Forming Protective Layer>

A blend solution for forming protective layer was prepared by mixing 40 parts of the compound K (trade name: Megafac F-120, a 5% aqueous solution, manufactured by Dainippon Ink & Chemicals, Inc.), 50 parts of sodium (4-nonylphenoxytrioxyethylene)butylsulfonate (a 2.0% aqueous solution, manufactured by Sankyo Kagaku Co., Ltd.) 49.87 parts of the dispersion solution of a pigment for protective layer, 16.65 parts of the dispersion solution of a matting agent for protective layer, and 48.7 parts of a dispersion solution of zinc stearate (trade name: HYDRIN F115, a 20.5% aqueous dispersion, manufactured by Chukyo Yushi Co., Ltd.) in 1000 parts of the polyvinyl alcohol solution for forming protective layer.

(7) Support Coated with a Primer Layer

<Preparation of a Solution for Forming Primer Layer>

An aqueous solution of gelatin for primer layer was prepared by dissolving 40 parts of enzyme-decomposed gelatin (having an average molecular weight of 10,000, a viscosity of 1.5 mPa's (15 mP) in accordance with PAGI, and a jelly strength of 20 g in accordance with PAGI) in 60 parts of ion-exchanged water at 40° C. while stirring.

On the other hand, 8 parts of water-swellable synthetic mica (having an aspect ratio of 1,000, trade name: SOMASIF ME100, manufactured by Cope Chemical Co., Ltd.) and 92 parts of water were mixed together and the resulting mixture was subjected to wet-dispersion by means of a Viscomill to thereby obtain a dispersion solution of mica having an average particle diameter of 2.0 μm. To the dispersion solution of mica was added water in an amount to obtain a mica concentration of 5% and the resulting mixture was homogenized by stirring. In this way, a dispersion solution of mica that was aimed at was prepared.

Next, 120 parts of water and 556 parts of methanol were added to 100 parts of the above-described 40% aqueous solution of gelatin and the resulting mixture was sufficiently stirred at 40° C. To the solution was added 208 parts of the dispersion solution having a mica concentration of 5% and the resulting mixture was sufficiently stirred. Next, 9.8 parts of a 1.66% polyethylene oxide surfactant was added. After that, the solution obtained above was kept at 35 to 40° C. and 7.3 parts of a gelatin hardener composed of an epoxy compound was added. In this way, a (5.7%) coating solution for forming primer layer was prepared.

<Manufacture of a Support Coated with a Primer Layer>

Wood pulp comprising 50 parts of LBPS and 50 parts of LBPK was beaten to 300 mL in Canadian Freeness by means of a disc refiner and was admixed with 0.5 parts of epoxidized behenic acid amide, 1.0 part of anionic polyacrylamide, 1.0 part of aluminum sulfate, 0.1 parts of a polyamidepolyamine/epichlorohydrin, and 0.5 parts of cationic polyacrylamide, each measured under absolute dry conditions and based on the weight of the pulp. The pulp was fed to a long-mesh paper machine to produce a base paper having a base weight of 114 $g/m^2$, which was then adjusted to a thickness of 100 μm by calendering.

Next, after both sides of the base paper were subjected to a corona-discharge treatment, one of the sides of the base paper was coated with a polyethylene resin to a resin layer thickness of 36 μm by means of a melt-extruder and thus a resin layer having a mat surface was formed (this face is hereinafter referred to as the back). After that, the other side, i.e., the side opposite to the side having the above-mentioned resin layer, of the base paper was coated with a polyethylene resin, which contained an amount of 10% of anatase-type titanium dioxide and a tiny amount of ultramarine blue, to a resin layer thickness of 50 μm by means of a melt-extruder and thus a resin layer having a glossy surface was formed (this face is hereinafter referred to as the front). The polyethylene resin coating layer on the back was subjected to a corona discharge treatment and then coated with an antistatic agent comprising an aqueous dispersion of aluminum oxide (trade name: Alumina Sol 100, manufactured by Nissan Chemical Industries, Co., Ltd.) and silicon dioxide (trade name: SNOWTEX O, manufactured by Nissan Chemical Industries, Co., Ltd.) in 1:2 weight ratio such that a dry coating weight of 0.2 $g/m^2$ was obtained. Next, the polyethylene resin coating layer on the front of the paper was subjected to a corona discharge treatment and thereafter coated with the above-described coating solution for forming primer layer such that a coating weight of mica of 0.26 $g/m^2$ was obtained. In this way, a support coated with a primer layer was obtained.

(7) Application of the Solutions for Forming Heat-Sensitive Layers

The support coated with a primer layer was coated consecutively with the solution (a) for forming yellow heat-sensitive recording layer, the solution for forming interlayer, the solution (b) for forming magenta heat-sensitive recording layer, the solution for forming interlayer, the solution (c) for forming cyan heat-sensitive recording layer, the solution for forming light-transmittance controlling layer, and the solution for forming protective layer, thus providing 7 layers in the order listed. The support coated with these layers was then dried at 30° C. and 30% RH and thereafter at 40° C. and 30% RH. In this way, a multicolor heat-sensitive recording material of Example 1 was obtained.

When applying the coating solutions, the coating weight of the solution (a) for forming heat-sensitive recording layer was controlled such that the coating weight of the diazo compound (A) contained in the solution (a) was 0.078 $g/m^2$ based on the solid component, the coating weight of the solution (b) for forming heat-sensitive recording layer was controlled such that the coating weight of the diazo compound (D) contained in the solution (b) was 0.206 $g/m^2$ based on the solid component, and the coating weight of the solution (c) for forming heat-sensitive recording layer was controlled such that the coating weight of the electron-donating dye (H) contained in the solution (c) was 0.355 $g/m^2$ based on the solid component.

Likewise, the coating weight of the solution for forming interlayer between (a) and (b) was controlled such that the coating weight based on the solid components was 2.39 $g/m^2$, the coating weight of the solution for forming interlayer between (b) and (c) was controlled such that the coating weight based on the solid components was 3.34 $g/m^2{}_1$ the coating weight of the solution for forming light-transmittance controlling layer was controlled such that the coating weight based on the solid components was 2.35 $g/m^2$, and the coating weight of the solution for forming protective layer was controlled such that the coating weight based on the solid components was 1.39 $g/m^2$.

<Assessments>

The multicolor heat-sensitive recording material obtained was exposed to irradiation from an ultraviolet lamp having a central wavelength of emission of 420 nm and an output of 40W for 10 seconds and further exposed to radiation from an ultraviolet lamp having a central wavelength of emission of 365 nm and an output of 40W for 15 seconds. As a result, a yellow image was obtained. After that, the heat-sensitive recording material was exposed for 96 hours to a radiation wavelength of 420 nm at a radiation power of 0.9 $W/m^2$ using an irradiating apparatus ("WEATHEROMETER CI 65" manufactured by Atlas Electric Device Corp.) After the irradiation, the yellowness (Y value) of the white background was measured by means of X-Rite model 310 (manufactured by X-Rite Incorporated). The results are shown in Table 7.

Examples 2 to 4

Multicolor heat-sensitive recording materials of Examples 2 to 4 were manufactured in the same way as in Example 1, except that the hydrogen donor (A-1) of the solution of microcapsules enclosing an ultraviolet absorber precursor was replaced with the compounds, respectively, according to Table 7. The assessments were carried out in the same way as in Example 1 and the results are shown in Table 7.

A-2

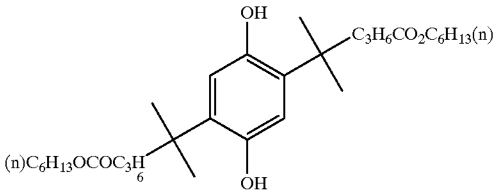

A-3

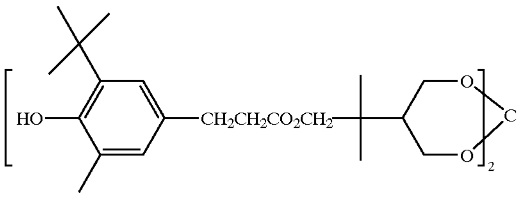

A-4

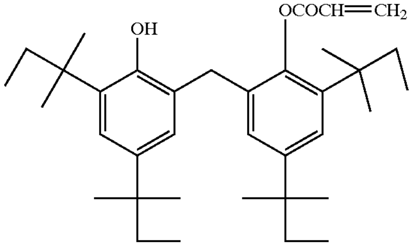

Comparative Example 1

The multicolor heat-sensitive recording material of Comparative Example 1 was manufactured in the same way as in Example 1, except that the hydrogen donor (A-1) of the solution containing microcapsules enclosing an ultraviolet absorber precursor was not used. The assessment was carried out in the same way as in Example 1 and the result is shown in Table 7.

TABLE 7

| | Hydrogen donor | Background density of non-image area after exposure |
|---|---|---|
| Example 1 | A-1 | 0.2 |
| Example 2 | A-2 | 0.21 |
| Example 3 | A-3 | 0.23 |
| Example 4 | A-4 | 0.22 |
| Comparative Example 1 | none | 0.31 |

What is claimed is:

1. A heat-sensitive recording material comprising a support, a heat-sensitive recording layer, a light-transmittance controlling layer, and a protective layer in this order, wherein the light-transmittance controlling layer includes an ultraviolet light absorber precursor which forms an ultraviolet light absorber by being irradiated with light and a hydrogen donor.

2. The heat-sensitive recording material according to claim 1, wherein the ultraviolet light absorber precursor is at least one kind selected from the compounds represented by the following general formulae (1) to (4):

General formula (1)

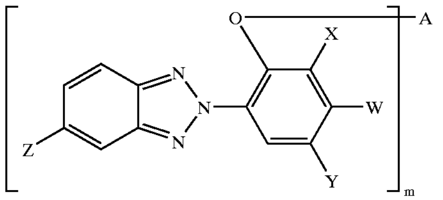

General formula (2)

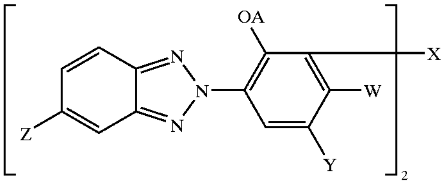

General formula (3)

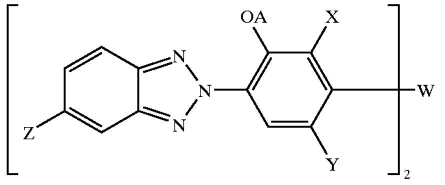

General formula (4)

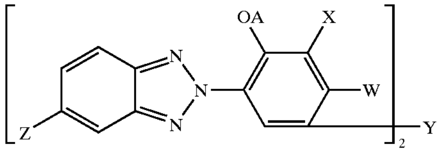

wherein m represents 1 or 2; A represents $—SO_2—R$, $—CO—R$, $—CO_2—R$, $—CONH—R$, $—POR_1R_2$, $—CH_2R_3$, or $SiR_4R_5R_6$ in the general formula (1) where m is 1 and in the general formulae (2) to (4); A represents $—SO_2R_7SO_2—$, $—CO—$, $—COCO—$, $—COR_7CO—$, $—SO_2—$, or $SO—$ in the general formula (1) where m is 2; X represents a hydrogen atom, an alkyl group, an alkoxy group, an aryl group, or a halogen atom in the general formulae (1), (3), and (4); X represents an alkylene group, $—OR_7O—$, or $OCOR_7CO_2—$ in the general formula (2); W represents a hydrogen atom, an alkyl group, an alkoxy group, an aryl group, or a halogen atom in the general formulae (1), (2), and (4); W represents $—OR_7O—$ or $—OCOR_7CO_2—$ in the general formula (3); Y represents a hydrogen atom, an alkyl group, an alkoxy group, an aryl group, or a halogen atom in the general formulae (1), (2), and (3); Y represents $—OR_7O—$, $—OCOR_7CO_2—$, $—CH_2CH_2CO_2R_7OCOCH_2CH_2—$, $—CH_2CH_2OCOR_7CO_2CH_2CH_2—$, or $CH_2CH_2CON(R_8)R_7N(R_8)COCH_2CH_2—$ in the general formula (4); and Z represents a hydrogen atom, a halogen atom, an alkyl group, or an alkoxy group; with the proviso that R represents an alkyl group or an aryl group; $R_1$ and $R_2$ each represents an alkoxy group, an aryloxy group, an alkyl group, or an aryl group; $R_3$ represents a phenyl group bearing at least one nitro or methoxy group as a substituent; $R_4$, $R_5$ and $R_6$ each represents an alkyl group or an aryl group; $R_7$ represents an alkylene group or an arylene group; and $R_8$ represents a hydrogen atom or an alkyl group.

3. The heat-sensitive recording material according to claim 1, wherein the hydrogen donor has at least one group selected from an aromatic OH group, an aliphatic OH group, a heterocyclic OH group, an aromatic SH group, an aliphatic SH group, a heterocyclic SH group, an aromatic NH group, an aliphatic NH group, and a heterocyclic NH group.

4. The heat-sensitive recording material according to claim 2, wherein the proportion of the hydrogen donor is 1 to 1000% by weight relative to the compound represented by any of the general formulae (1) to (4).

5. The heat-sensitive recording material according to claim 4, wherein the proportion of the hydrogen donor is 5 to 300% by weight relative to the compound represented by any of the general formulae (1) to (4).

6. The heat-sensitive recording material according to claim 2, wherein the coating weight of the compound represented by any of the general formulae (1) to (4) is 0.1 to 1.5 $g/m^2$.

7. The heat-sensitive recording material according to claim 2, wherein the heat-sensitive recording material further contains microcapsules and the compound represented by any of the general formulae (1) to (4) and the hydrogen donor are enclosed in the same microcapsule.

8. The heat-sensitive recording material according to claim 7, wherein the particle diameters of the microcapsules are 0.05 to 1.0 μm.

9. The heat-sensitive recording material according to claim 2, wherein the heat-sensitive recording material further contains the compound represented by the following general formula (5):

general formula (5)

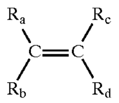

wherein $R_a$ to $R_d$ each represents a hydrogen atom, an unsubstituted or substituted alkyl group, an alkoxy group, an ester group, an aryl group, or a halogen atom.

10. The heat-sensitive recording material according to claim 9, wherein the content of the compound represented by the general formula (5) is 0.05 to 20 times the content of the compound represented by any of the general formulae (1) to (4).

11. A heat-sensitive recording material comprising a support, a photo-fixing type heat-sensitive recording layer, an interlayer, a light-transmittance controlling layer, and a protective layer in this order, wherein the light-transmittance controlling layer includes an ultraviolet light absorber precursor and a hydrogen donor.

12. The heat-sensitive recording material according to claim 11, wherein the ultraviolet light absorber precursor is at least one kind selected from the compounds represented by the following general formulae (1) to (4):

General formula (1)

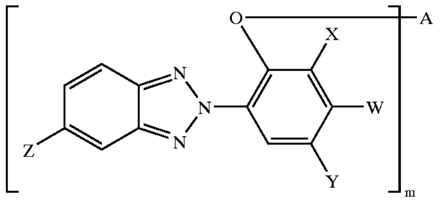

-continued

General formula (2)

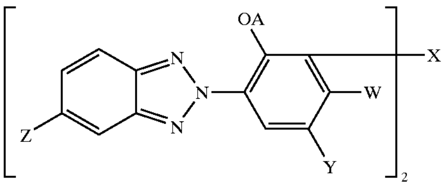

General formula (3)

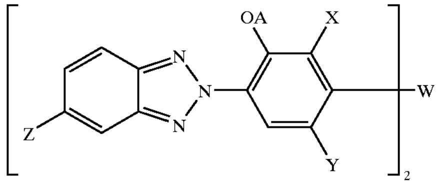

General formula (4)

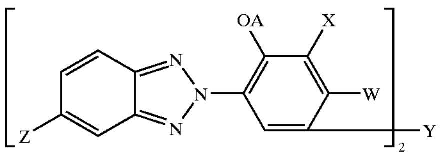

wherein m represents 1 or 2; A represents $—SO_2—R$, $—CO—R$, $—CO_2—R$, $—CONH—R$, $—POR_1R_2$, $—CH_2R_3$, or $—SiR_4R_5R_6$ in the general formula (1) where m is 1 and in the general formulae (2) to (4); A represents $—SO_2R_7SO_2—$, $—CO—$, $—COCO—$, $—COR_7CO—$, $—SO_2—$, or $—SO—$ in the general formula (1) where m is 2; X represents a hydrogen atom, an alkyl group, an alkoxy group, an aryl group, or a halogen atom in the general formulae (1), (3), and (4); X represents an alkylene group, $—OR_7O—$, or $—OCOR_7CO_2—$ in the general formula (2); W represents a hydrogen atom, an alkyl group, an alkoxy group, an aryl group, or a halogen atom in the general formulae (1), (2), and (4); W represents $—OR_7O—$ or $—OCOR_7CO_2—$ in the general formula (3); Y represents a hydrogen atom, an alkyl group, an alkoxy group, an aryl group, or a halogen atom in the general formulae (1), (2), and (3); Y represents $—OR_7O—$, $—OCOR_7CO_2—$, $—CH_2CH_2CO_2R_7OCOCH_2CH_2—$, $—CH_2CH_2OCOR_7CO_2CH_2CH_2—$, or $—CH_2CH_2CON(R_8)R_7N(R_8)COCH_2CH_2—$ in the general formula (4); and Z represents a hydrogen atom, a halogen atom, an alkyl group, or an alkoxy group; with the proviso that R represents an alkyl group or an aryl group; $R_1$ and $R_2$ each represents an alkoxy group, an aryloxy group, an alkyl group, or an aryl group; $R_3$ represents a phenyl group bearing at least one nitro or methoxy group as a substituent; $R_4$, $R_5$, and $R_6$ each represents an alkyl group or an aryl group; $R_7$ represents an alkylene group or an arylene group; and $R_7$ represents a hydrogen atom or an alkyl group.

13. The heat-sensitive recording material according to claim 11, wherein the hydrogen donor has at least one group selected from an aromatic OH group, an aliphatic OH group, a heterocyclic OH group, an aromatic SH group, an aliphatic SH group, a heterocyclic SH group, an aromatic NH group, an aliphatic NH group, and a heterocyclic NH group.

14. The heat-sensitive recording material according to claim 11 which has a plurality of the photo-fixing type heat-sensitive recording layers.

15. The heat-sensitive recording material according to claim 14 which has a photo-fixing type heat-sensitive recording layer containing a diazonium salt compound whose maximum absorption wavelength is 365+40 nm and a coupler which reacts with the diazonium salt compound to develop a color and a photo-fixing type heat-sensitive recording layer containing a diazonium salt compound whose maximum absorption wavelength is 425±40 nm and a coupler which reacts with the diazonium salt compound to develop a color.

16. The heat-sensitive recording material according to claim 14 which has a photo-fixing type heat-sensitive recording layer containing a diazonium salt compound whose maximum absorption wavelength is less than 380 nm and a coupler which reacts with the diazonium salt compound to develop a color and a photo-fixing type heat-sensitive recording layer containing a diazonium salt compound whose maximum absorption wavelength is more than 390 nm and a coupler which reacts with the diazonium salt compound to develop a color.

17. A multicolor heat-sensitive recording material comprising a support, a plurality of photo-fixing type heat-sensitive recording layers, a light-transmittance controlling layer, and a protective layer in this order, wherein the photo-fixing type heat-sensitive recording layers develop yellow, magenta, and cyan, respectively, so that full-color recording can be carried out, and the light-transmittance controlling layer includes an ultraviolet light absorber precursor and a hydrogen donor.

18. The heat-sensitive recording material according to claim 17, wherein the ultraviolet light absorber precursor is at least one kind selected from the compounds represented by the following general formulae (1) to (4):

General formula (1)

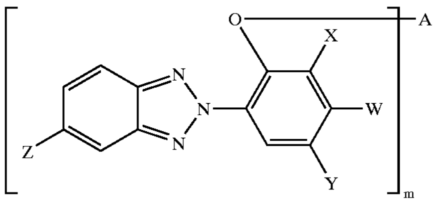

General formula (2)

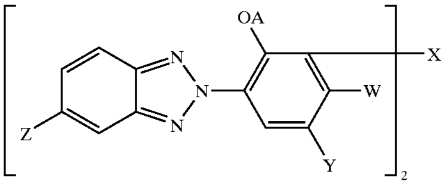

General formula (3)

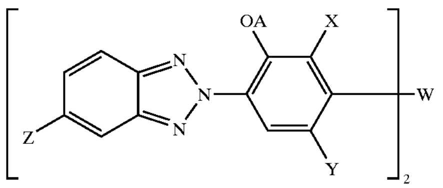

-continued

General formula (4)

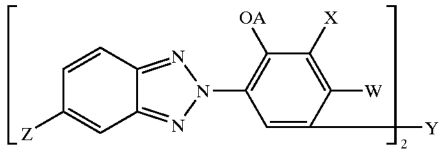

wherein m represents 1 or 2; A represents $—SO_2—R$, —CO—R, $—CO_2—R$, —CONH—R, $—POR_1R_2$, $—CH_2R_3$, or $—SiR_4R_5R_6$ in the general formula (1) where m is 1 and in the general formulae (2) to (4); A represents $—SO_2R_7SO_2—$, —CO—, —COCO—, $—COR_7CO—$, $—SO_2—$, or —SO— in the general formula (1) where m is 2; X represents a hydrogen atom, an alkyl group, an alkoxy group, an aryl group, or a halogen atom in the general formulae (1) (3), and (4); X represents an alkylene group, $—OR_7O—$, or $—OCOR_7CO_2—$ in the general formula (2); W represents a hydrogen atom, an alkyl group, an alkoxy group, an aryl group, or a halogen atom in the general formulae (1), (2), and (4); W represents $—OR_7O—$ or $—OCOR_7CO_2—$ in the general formula (3); Y represents a hydrogen atom, an alkyl group, an alkoxy group, an aryl group, or a halogen atom in the general formulae (1), (2), and (3); Y represents $—OR_7O—$, $—OCOR_7CO_2—$, $—CH_2CH_2CO_2R_7OCOCH_2CH_2—$, $—CH_2CH_2OCOR_7CO_2CH_2CH_2—$, or $—CH_2CH_2CON(R_8)R_7N(R_8)COCH_2CH_2—$ in the general formula (4); and Z represents a hydrogen atom, a halogen atom, an alkyl group, or an alkoxy group; with the proviso that R represents an alkyl group or an aryl group; $R_1$ and $R_2$ each represents an alkoxy group, an aryloxy group, an alkyl group, or an aryl group; $R_3$ represents a phenyl group bearing at least one nitro or methoxy group as a substituent; $R_4$, $R_5$, and $R_6$ each represents an alkyl group or an aryl group; $R_7$ represents an alkylene group or an arylene group; and $R_8$ represents a hydrogen atom or an alkyl group.

19. The heat-sensitive recording material according to claim 17, wherein the hydrogen donor has at least one group selected from an aromatic OH group, an aliphatic OH group, a heterocyclic OH group, an aromatic SH group, an aliphatic SH group, a heterocyclic SH group, an aromatic NH group, an aliphatic NH group, and a heterocyclic NH group.

20. The multicolor recording material according to claim 18, wherein the compound represented by any of the general formulae (1) to (4) and the hydrogen donor are contained in the same layer.

21. The heat-sensitive recording material according to claim 1, wherein the light-transmittance controlling layer includes microcapsules that encapsulate the ultraviolet light absorber precursor and the hydrogen donor.

22. The heat-sensitive recording material according to claim 11, wherein the light-transmittance controlling layer includes microcapsules that encapsulate the ultraviolet light absorber precursor and the hydrogen donor.

23. The multicolor heat-sensitive recording material according to claim 17, wherein the light-transmittance controlling layer includes microcapsules that encapsulate the ultraviolet light absorber precursor and the hydrogen donor.

* * * * *